(12) United States Patent
Nisany et al.

(10) Patent No.: US 8,281,674 B2
(45) Date of Patent: Oct. 9, 2012

(54) WAFER INSPECTION SYSTEM AND A METHOD FOR TRANSLATING WAFERS [PD]

(75) Inventors: Itzik Nisany, Herzeliya (IL); Amir Gilead, Haifa (IL); Michael Vainer, Yoqneam Elit (IL); Valery Nuzni, Mahalot (IL)

(73) Assignee: Camtek Ltd., Migdal Haemeq (IL)

( * ) Notice: Subject to any disclaimer, the term of this patent is extended or adjusted under 35 U.S.C. 154(b) by 312 days.

(21) Appl. No.: 12/064,353

(22) PCT Filed: Aug. 24, 2006

(86) PCT No.: PCT/IL2006/000987
§ 371 (c)(1),
(2), (4) Date: Dec. 31, 2008

(87) PCT Pub. No.: WO2007/023501
PCT Pub. Date: Mar. 1, 2007

(65) Prior Publication Data
US 2009/0183583 A1 Jul. 23, 2009

Related U.S. Application Data

(60) Provisional application No. 60/711,427, filed on Aug. 26, 2005.

(51) Int. Cl.
*G01M 19/00* (2006.01)

(52) U.S. Cl. .................................................. 73/865.8
(58) Field of Classification Search .................. None
See application file for complete search history.

(56) References Cited

U.S. PATENT DOCUMENTS

| 5,479,108 | A | 12/1995 | Cheng |
| 5,991,005 | A * | 11/1999 | Horikawa et al. ............... 355/53 |
| 6,137,303 | A | 10/2000 | Deckert et al. |
| 6,160,415 | A | 12/2000 | Jung |
| 6,709,218 | B1 * | 3/2004 | Freerks et al. ................. 414/217 |
| 7,108,471 | B2 * | 9/2006 | Osuga ....................... 414/222.01 |
| 2009/0252582 | A1 * | 10/2009 | Bluck et al. ............. 414/222.07 |

FOREIGN PATENT DOCUMENTS

WO  WO2007/023501 A3  3/2007

* cited by examiner

*Primary Examiner* — Robert R Raevis
(74) *Attorney, Agent, or Firm* — Reches Patents

(57) ABSTRACT

A method for inspecting a wafer and a system. The system includes: a chuck; and a robot that includes a movable element connected to a detachable adaptor selected from a group of diced wafer detachable adaptors and non-diced wafer detachable adaptors; wherein a diced wafer detachable adaptor is shaped such to partially surround the diced wafer and comprises at least one vacuum groove adapted to apply vacuum on a tape that supports the diced wafer; and wherein the robot is adapted to fetch the wafer from a cassette and to place the wafer on the chuck.

9 Claims, 25 Drawing Sheets

WAFER INSPECTION SYSTEM AND A METHOD FOR TRANSLATING WAFERS [PD]

RELATED APPLICATIONS

This patent application claims priority from U.S. provisional application Ser. No. 60/711,427, filed 26 Aug. 2005.

FIELD OF THE INVENTION

The invention relates to wafer inspection systems and to a method for translating wafers.

BACKGROUND OF THE INVENTION

Integrated circuits are manufactured by a highly complex and costly manufacturing process. The production is formed at wafer level and is composed of numerous stages. A wafer includes multiple dice that are arranged in an ordered array of dice wherein the dice are parallel to each other. Rectangular-shaped dice are arranged in columns and rows and are separated by scribe lines.

During the final manufacturing stages of the wafer the wafer is diced (or sawn) in order to separate between the different dice. The wafer is usually placed on a tape that in turn is supported by a frame.

Different manufacturing processes provide wafers of different sizes. Today, the largest wafer has a diameter of 300 mm. Smaller wafers include, for example, 200 mm diameter wafers. Different diced wafers can be supported by frames of different sizes and shapes. The different shapes (especially differently shaped frame recesses) correspond to different frame standards.

Wafer inspection systems usually include a chuck adapted to support a wafer. The following patents and patent applications, all being incorporated herein by reference, illustrate prior art chucks and wafer holders:

U.S. Pat. No. 6,097,204 of Tanaka et al.; Japanese patent serial number JP01273045 of Marumo et al.; Japanese patent serial number JP10032604 of Ishida; U.S. Pat. No. 6,992,500 of Sugiyama et al.; U.S. patent application publication serial number 2001/003772 of Sugiyama et al.; Japanese patent publication serial number JP200100920A2 of Tomita et al.; U.S. Pat. No. 6,917,420 of Traber; U.S. Pat. No. 6,914,423 of Nordgem et al.; U.S. Pat. No. 6,774,621 of Takekoshi; U.S. Pat. No. 6,634,245 of Yoshioka et al.; U.S. patent application publication serial number 2004/0179323 of Litman et al.; and U.S. patent application publication serial number 2005/0005702A1 of Osuga.

Modern wafer inspection systems are expected to be very fast, thus there is a need to speed up the wafer inspection process. In addition they are expected to be accurate, reliable and characterized by high repeatability.

There is a need to provide a fast wafer inspection system and especially a wafer inspection system adapted to inspect objects of different type and size.

SUMMARY OF THE INVENTION

A wafer inspection system that includes: a chuck; and a robot, including a movable element connected to a detachable adaptor selected from a group of diced wafer detachable adaptors and non-diced wafer detachable adaptors; wherein a diced wafer detachable adaptor is shaped such to partially surround the diced wafer and includes at least one vacuum groove adapted to apply vacuum on a tape that supports the diced wafer; and wherein the robot is adapted to fetch the wafer from a cassette and to place the wafer on the chuck.

A wafer inspection system that includes: a chuck; and a robot adapted to place a wafer on the chuck; wherein the chuck includes a porous interface plate adapted to support a object, wherein through the porous interface plate vacuum is developed.

A wafer inspection system that includes: an inspection head adapted to inspect an object placed at an inspection area; and a chuck adapted to place, at the inspection area, a selected frame that supports a diced wafer; wherein the selected frame is selected out of a group of frames that have different sizes and different sized recesses; wherein the chuck includes multiple sets of immobile register element holders and at least one movable register element; wherein each set of immobile register element holders is adapted to hold an immobile register element; and wherein a spatial relationship between each set of an immobile register element holders and a movable register element is responsive to a size of the selected frame.

A wafer inspection system that includes: a cassette holder, adapted to sense a size characteristic of a cassette; wherein the cassette is adapted to hold multiple objects such as non-diced wafers or frames that support diced wafers; a controller, adapted to determine a size of the object in response to the sensed size characteristic of the cassette, and adapted to determine a height of an identification position, in response to the size of the object; a wafer identifier, adapted to read object identification information, when the object is positioned at the identification position; a robot, adapted to fetch the object from the cassette, place the object at the identification position, place the object on a chuck if the object was successfully identified, or rotate the object such as to enable another identification session if the object was not successfully identified and a chuck adapted to support the object while a portion of the object is being inspected.

A wafer inspection system that includes: a chuck adapted to support a first object during inspection and to locate the first object near an object removal station at the end of the inspection; an object removal station adapted to fetch the first object after the inspection ends; and a robot adapted to place a second object on the chuck immediately after the object removal station fetches the first object from the chuck; wherein the object is a non-diced wafer or a frame that supports a diced wafer. The first object is then provided to the robot that returns the object to its cassette.

A method for translating a wafer, the method includes: selecting a detachable adaptor out of a group of diced wafer detachable adaptors and non-diced wafer detachable adaptors, in response to a size and a shape of a non-diced wafer or a frame supporting a diced wafer; fetching an object from a cassette by placing the objects on the selected detachable adaptor and applying vacuum; wherein if the fetched object is a frame supporting a diced wafer then the placing includes placing the frame on the selected detachable adaptor that is shaped such to partially surround the diced wafer and the applying includes applying vacuum on a tape that supports the diced wafer, by a vacuum groove; and placing the wafer on a chuck.

A method for inspecting a wafer, the method includes: placing an object on a chuck that includes a porous interface plate; wherein the object is selected from a group consisting of a non-diced wafer and a frame supporting a diced wafer; and applying vacuum through the porous interface plate vacuum.

A method for inspecting a wafer that includes: selecting an immobile register element shaped according to a shape and size of a frame to be supported by a chuck; connecting the selected immobile register element to a set of selected immobile register element holder out of multiple sets of immobile register element holders positioned in response to possible shapes and sizes of frames supported by the chuck; placing the frame between the selected immobile register element and a movable register element; and inspecting the object to detect defects.

A method for inspecting a wafer that includes: sensing a size characteristic of a cassette; wherein the cassette is adapted to hold multiple objects selected from a group consisting of a non-diced wafer and frame supporting a diced wafer; determining a size of the object in response to the sensed size characteristic of the cassette; determining a height of an identification position, in response to the size of the object; reading object identification information, when the object is positioned at a first identification position; rotating the object to a second identification position and reading object identification information if a previous reading attempt failed; and placing the object on the chuck and inspecting the object.

A method for inspecting a wafer that includes: supporting a first object and moving the first object along an inspection area, wherein the first object is a non-diced wafer or a frame supporting a diced wafer; fetching a second object; removing the first object from the chuck by the object removal station and placing the second object on the chuck; taking the first wafer from the object removal station and placing it to the cassette of the first object.

BRIEF DESCRIPTION OF THE DRAWINGS

The present invention will be understood and appreciated more fully from the following detailed description taken in conjunction with the drawings in which:

FIGS. 6-8 illustrate a chuck, according to an embodiment of the invention;

DETAILED DESCRIPTION OF THE DRAWINGS

Figure 1:
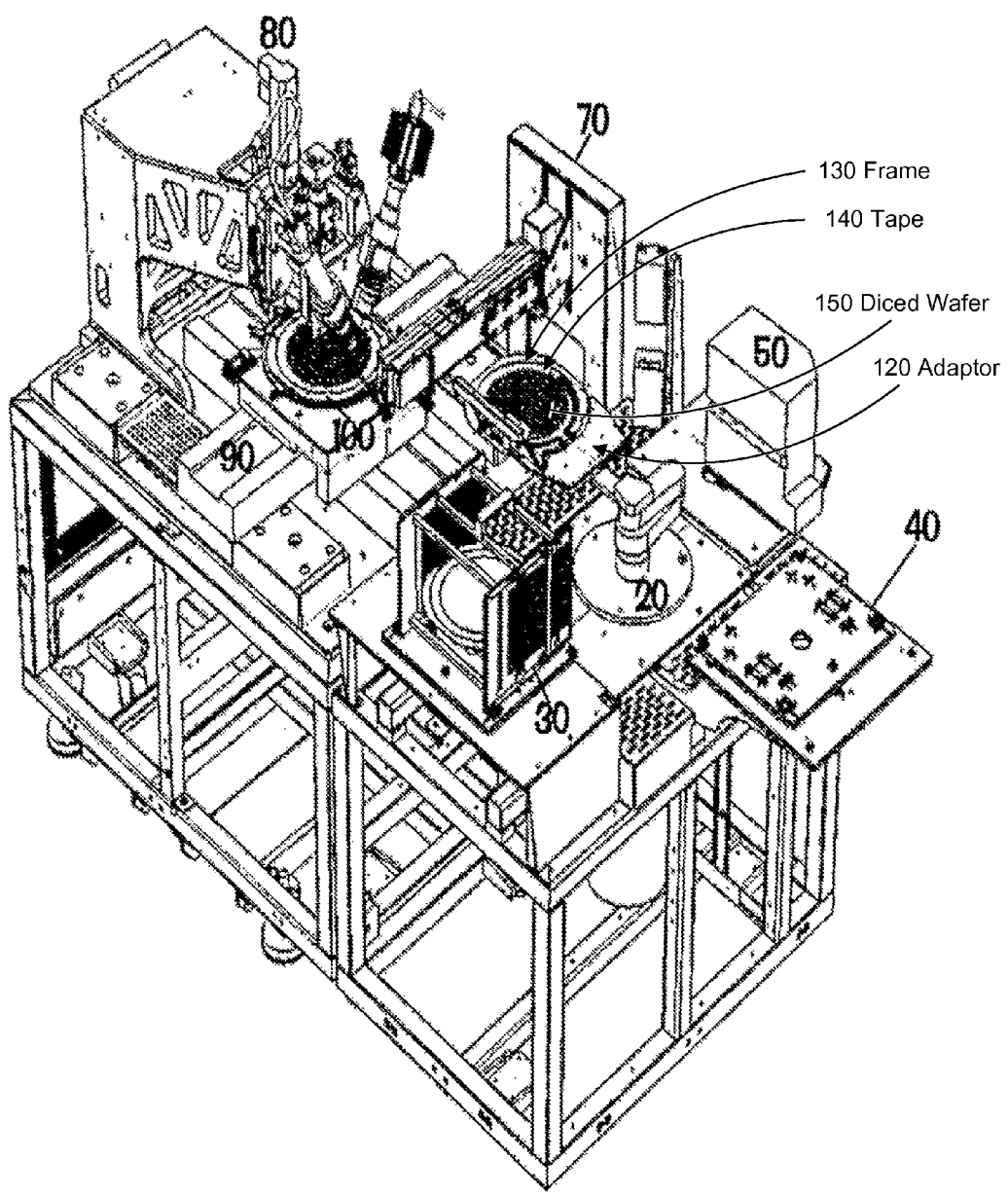
FIGS. 1-3 illustrate a portion of a wafer inspection system, according to an embodiment of the invention.

Various embodiments of the invention are herein described, by way of example only, with reference to the accompanying drawings. With specific reference now to the drawings in detail, it is stressed that the particulars shown are by way of example and for purposes of illustrative discussion of the preferred embodiments of the present invention only, and are presented in the cause of providing what is believed to be the most useful and readily understood description of the principles and conceptual aspects of the invention. In this regard, no attempt is made to show structural details of the invention in more detail than is necessary for a fundamental understanding of the invention, the description taken with the drawings making apparent to those skilled in the art how the several forms of the invention may be embodied in practice.

A fast wafer inspection system is provided. The wafer inspection system can inspect non-diced wafers of different sizes and diced wafers supported by frames of different sizes and shapes. The wafer inspection system includes an object translation system that is adapted to translate between non-diced wafers and frames that support diced wafers of different sizes and shapes. The non-diced wafers can include 200 mm non-diced wafers and 300 mm non-diced wafers. The frames can include 6" Disco frames, 6" K&S frames, 8" Disco frames, 8" K&S Frames and 12" frames. It is noted that other sized objects can be translated and inspected by the wafer inspection system.

The object translation system can easily adapt itself to objects of different sized and types. Some of the adjustments are made automatically while some adjustments require manual intervention. It is noted that some of the manual adaptation described below can be replaced by automatic adjustments and vice verse.

The object translation system can work in a pipelined manner, thus speeding up various pre-inspection stages. The object translation system is adapted to take an object from a cassette, identify the object by reading a visual code (such as barcode) imprinted on the object, optionally provide the object to a pre-aligner and optical code recognizer (if, for example, the object is a non-diced wafer), place the object on a chuck in an aligned manner, inspect the object by moving the chuck conveniently along X and Y directions, remove the object from the chuck by a object removal station and provide a next wafer to the chuck.

Conveniently, diced wafer detachable adaptors have a horseshoe (or a fork) shape in order to avoid contact between the adaptor and the diced wafer. The diced wafer detachable adaptors include internal vacuum conduits that end by vacuum grooves that are placed such as to define vacuum areas at the tape that holds the diced wafer, conveniently, near the inner edge of the frame.

Conveniently, each wafer detachable adaptors is attached to a movable element of a robot (such as the robot's arm) by multiple screws and a positioning pin.

Conveniently, in order to eliminate chipping hazard during frame lifting, an air puff is developed under the frame after the vacuum is turned off. This may involve using a controlled solenoid that delivers air pressure to chuck right after vacuum is terminated.

Conveniently, the chuck includes multiple movable supporting pins that can be selectively lifter and lowered. Conveniently some of the pins are shaped and positioned such as to support frames of different sizes. When the supported object is a frame than the movable supporting pins contact the frame and not the died wafer.

Conveniently, in order to speed up object pre-inspection stages, registration (alternatively referred to object alignment in relation to the chuck) is executed while the object is being received by the chuck and especially while the object is being gradually lowered towards the upper surface of the chuck by a set of movable supporting pins. The registration utilizes an immobile register element ("Butterfly bracket") and a mobile register element such as a bearing element. The Bearing element is attached, at different distances per frame size and Standard, to an air piston that is triggered by the lowering of the movable supporting pins. The butterfly brackets are selected and attached to the chuck at different locations according to the selected frame size and Standard.

Figure 9:
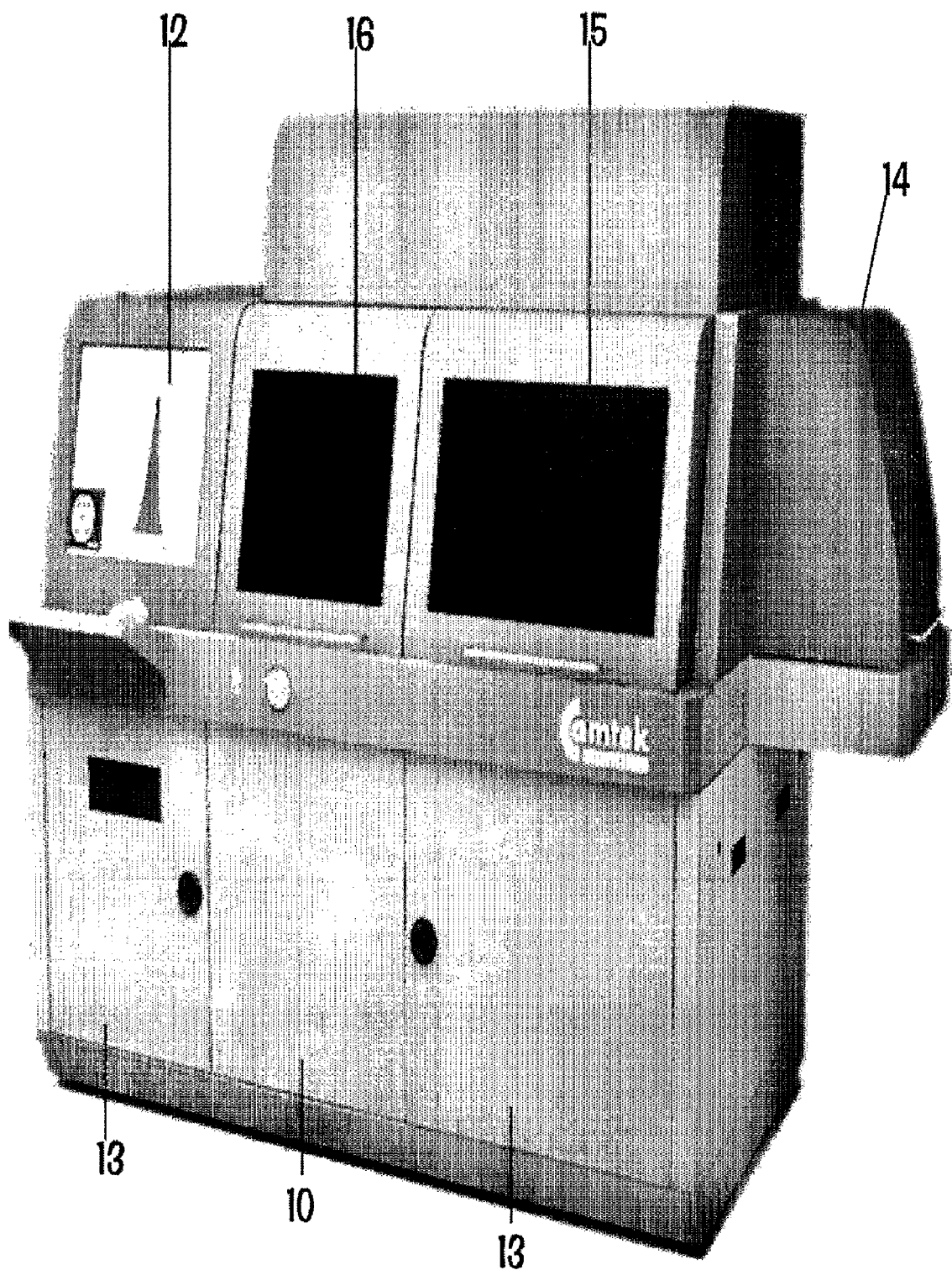
FIG. 9 illustrates a wafer inspection exterior, according to an embodiment of the invention.

FIG. 9 illustrates wafer inspection system 10, according to an embodiment of the invention.

FIG. 9 illustrates the exterior of wafer inspection system 10. It includes lower cabinets (collectively denoted 13) in which various components such as power supply components, image processing components, memory units, a controller and the like are placed. FIG. 9 also illustrates fan filter unit 16, display 12, left front door 15 and a structural element 14 extending to the left of wafer inspection system 10. A first cassette can be positioned behind left front door 15 and second cassette can be placed within structural element 14.

Display 12 is adapted to display wafer inspection scenarios and results, provide visual indication about the functionality of wafer inspection system 10 and the like.

Figure 2:
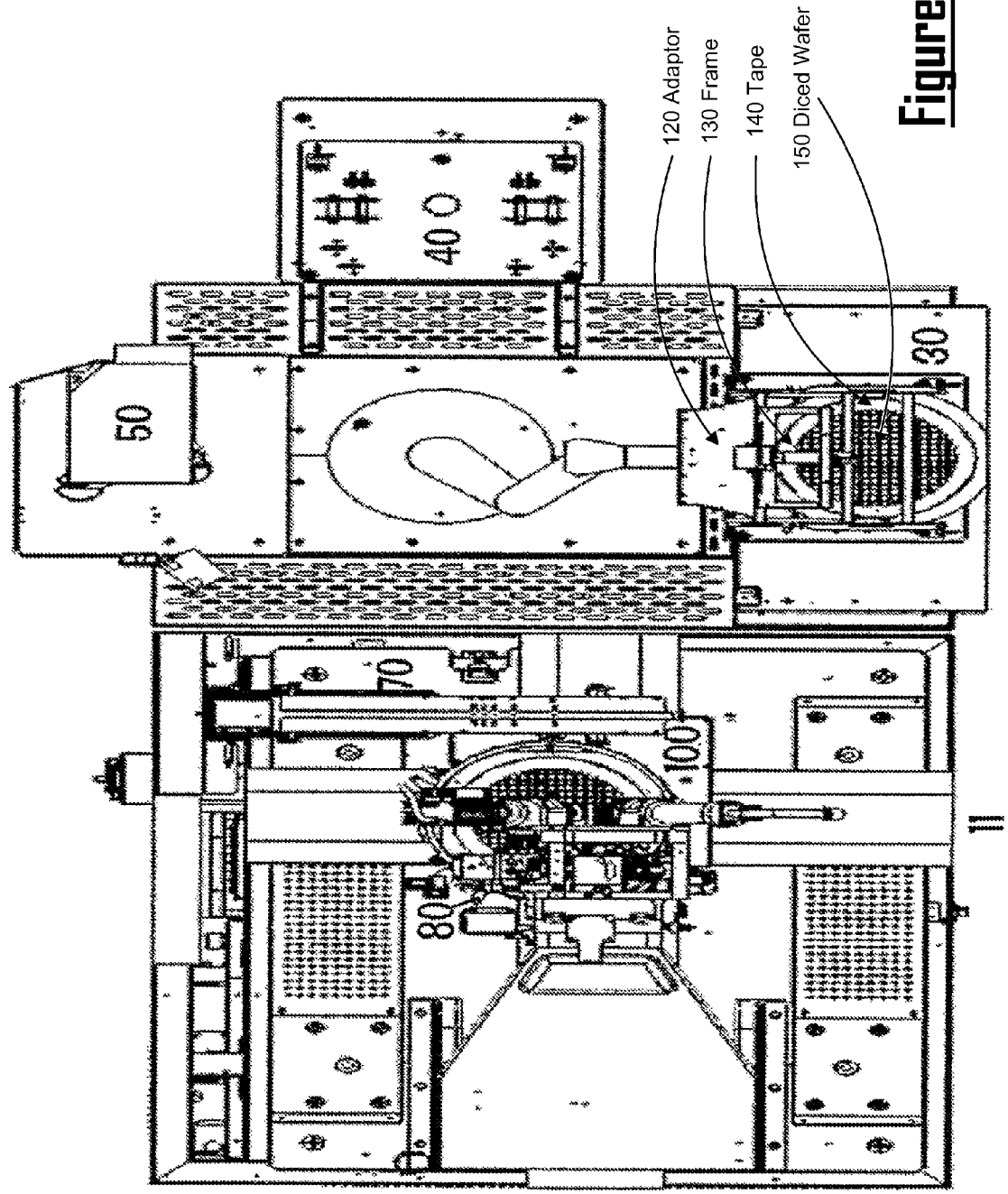
Figure 3:
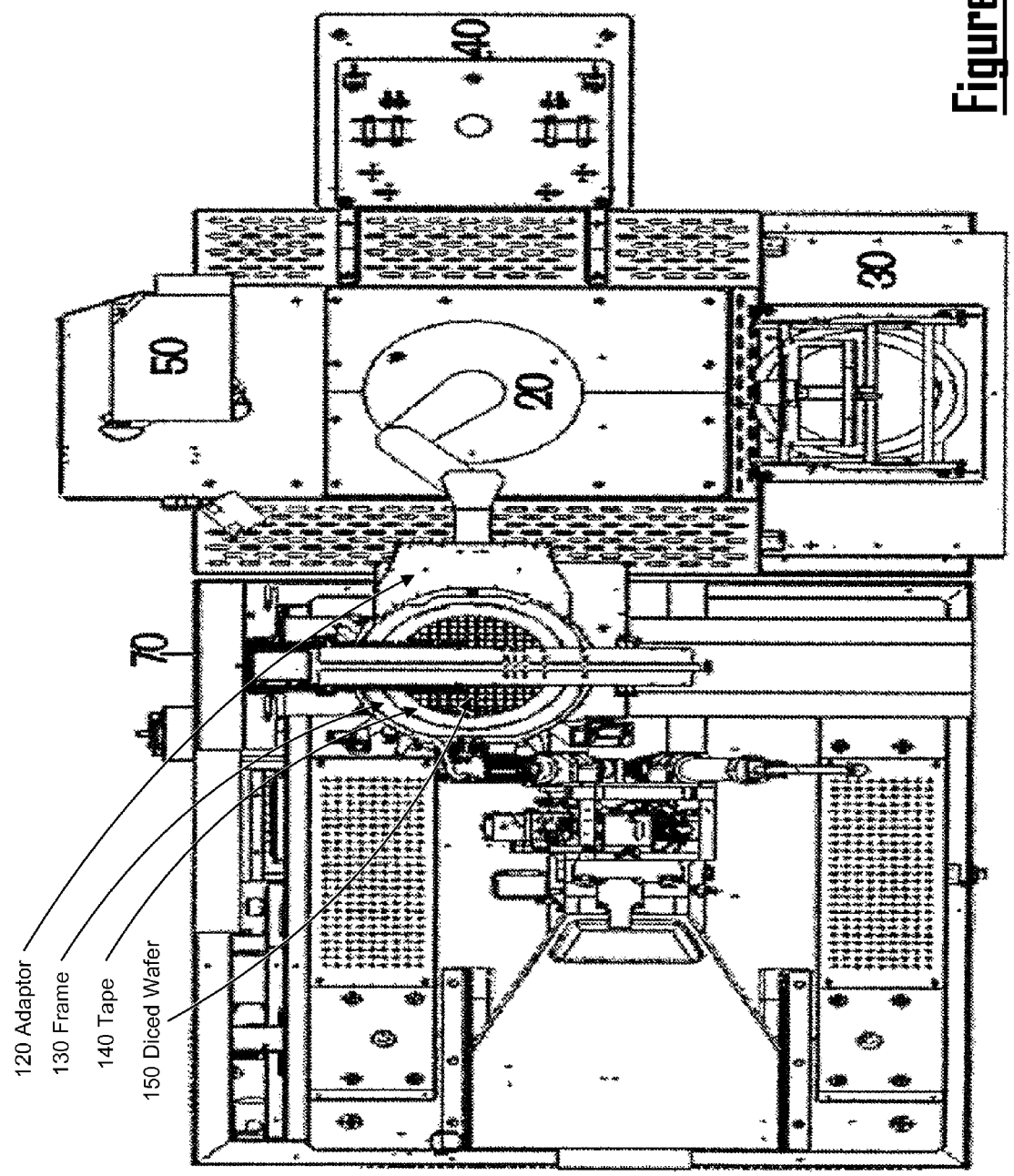

The interior of wafer inspection system is better illustrated in the following figures. It may include portion 11 that in turn may include multiple components, units and sub-systems that translate the object, identity the object and inspect the object. The object can be a non-diced wafer or a frame that supports a diced wafer. FIGS. 1-3 illustrate portion 11 of wafer inspection system 10, during different stages of its operation, according to an embodiment of the invention.

Portion 11 includes robot 20, first cassette holder 30, second cassette holder 40, pre-aligner and optical code recognizer 50, barcode reader (60 of FIG. 3), object removal station (also referred to as waiting station) 70, inspection head 80, chuck translator (such as an X-Y stage 90) and chuck 100.

Portion 11 is adapted to operate in a pipelined manner. While a k'th object is supported by chuck 100 and is moved (by X-Y stage 90) and inspected (by inspection head 80), robot 20 fetches the (k+1)'th object from its cassette, places the (k+1)'th object in an identification position that enables the barcode reader 60 to identify the (k+1)'th object and holds the (k+1)'th wafer in the robot safe position while the K'th wafer is scanned. At the end of the scanning the chuck 100 is positioned such that the k'th object can be removed from chuck 100 by object removal station 70. The (k+1)'th wafer is already placed (by robot 20) near the object removal station 70 and can be immediately placed on chuck 100. The K'th object is than placed back to the cassette. As aforementioned, the object can be a frame 130 that supports a diced wafer 150. In the examples illustrated in FIGS. 1-3, the diced wafer 150 is placed on tape 140, that in turn is supported by the frame 130. In the illustrated examples, frame 130 is supported by adaptor 120.

It can operate by having robot 20 scan the cassette and locate where are the object and starts fetching, one object after to other in order to initiate the inspection sequence of these objects.

FIGS. 1-3 also illustrate an empty second cassette holder 40 and first cassette holder 30 that carries a cassette.

Once the inspection of the k'th object is completed chuck 100 moves to an object removal position that enables object removal station 70 to pick the k'th object from chuck 100. Once the k'th object is removed from chuck 100, robot 20 moves toward the object removing station 70, places the (k+1)'th object on chuck 100, takes the k'th object from object removal station 70 and places the k'th object into its cassette.

Figure 4:
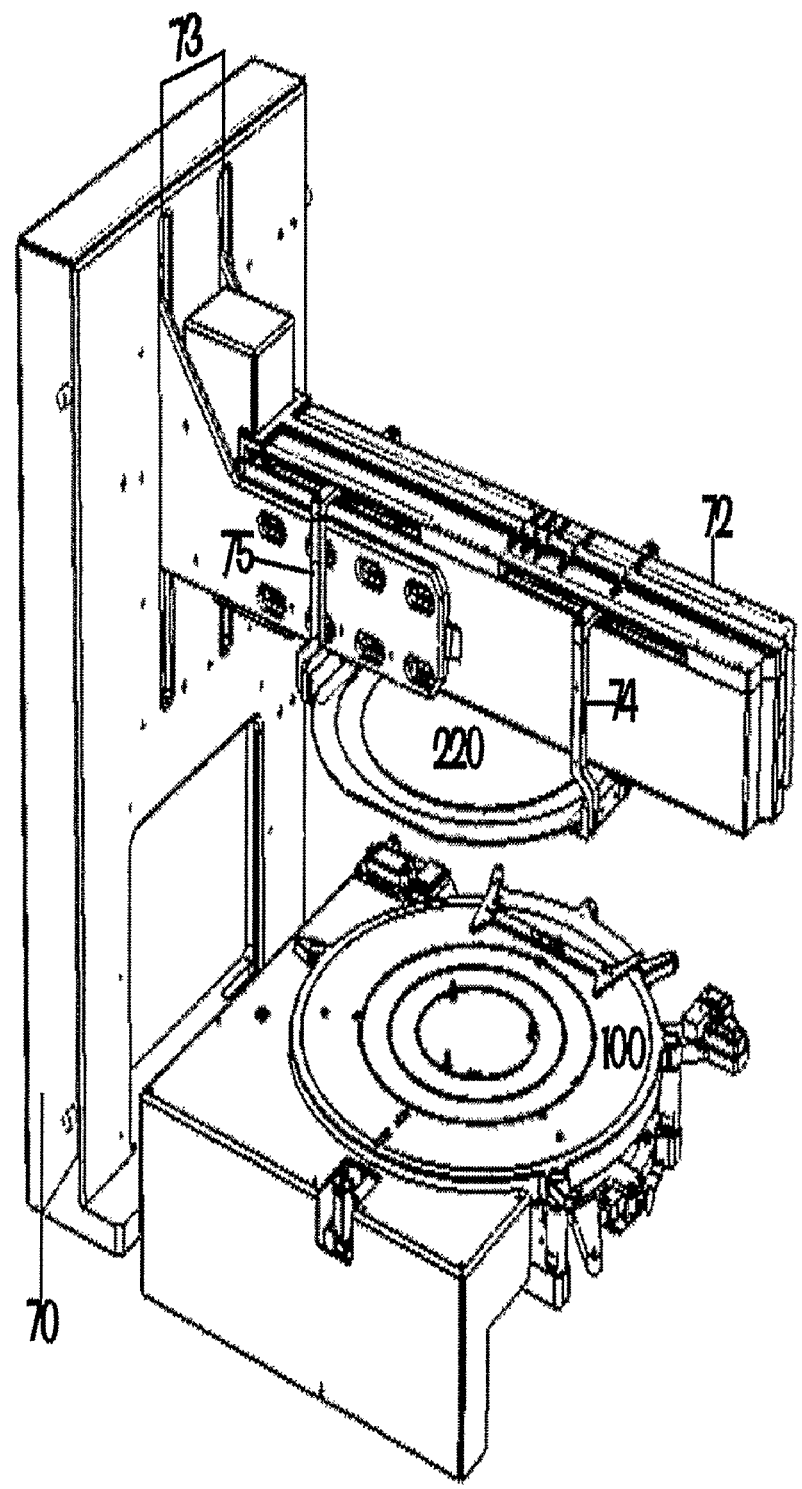
FIGS. 4-5 illustrate an object removal station, according to an embodiment of the invention.

FIGS. 1-3 illustrate three stages of the mentioned above pipelined operation of wafer inspection system 10. FIG. 3 illustrates the k'th object while being inspected by inspection head 80 while robot 20 fetches the (k+1)'th from its cassette. FIG. 2 illustrates the k'th object while being inspected by inspection head 80 while the (k+1)'th object is held, by robot 20, in the robot safe position area. FIG. 4 illustrates the k'th object as being held by the object removal station 70. System 10 is adapted to determine the size of the object by sensing the size of the cassette placed on first and/or second cassette holders 30 and 40. Each of said cassette holders is equipped with multiple sensors positioned in different locations that correspond to different cassette sizes and shapes. The sensing can involve sensing which light sensors are covered by a cassette placed on the cassette holder. Signals from these sensors are provided to a controller (not shown) that can determine the size of the object as well as its type (non-diced wafer or a frame supporting a diced wafer) in response to these signals.

Various operations of the object translation system 10 are responsive to the size (and type) of the object. For example, the barcode reader 60 is positioned in a tilted position such as to allow it to identify objects of different sizes by merely lowering or lifting an inspected object. Accordingly, system 10 can define the height of an identification position in response to the size of the object. Once the size of the object is determined robot 20 is instructed accordingly.

It is noted that each cassette holder out of cassette holders 30 and 40 can hold objects of different sizes.

Cassette holders 30 and 40 can support cassettes of the same size but this is not necessarily so. For example, second cassette holder 40 can support cassettes of larger wafers and frames in comparison to first cassette holder 30. For example, the inventors used a wafer inspection system 10 in which first cassette holder 30 was able to hold cassettes of wafers till 200 mm wafers, while second cassette holder 40 was adapted to support even larger cassettes (for example of 300 mm wafer cassettes).

Figure 5:
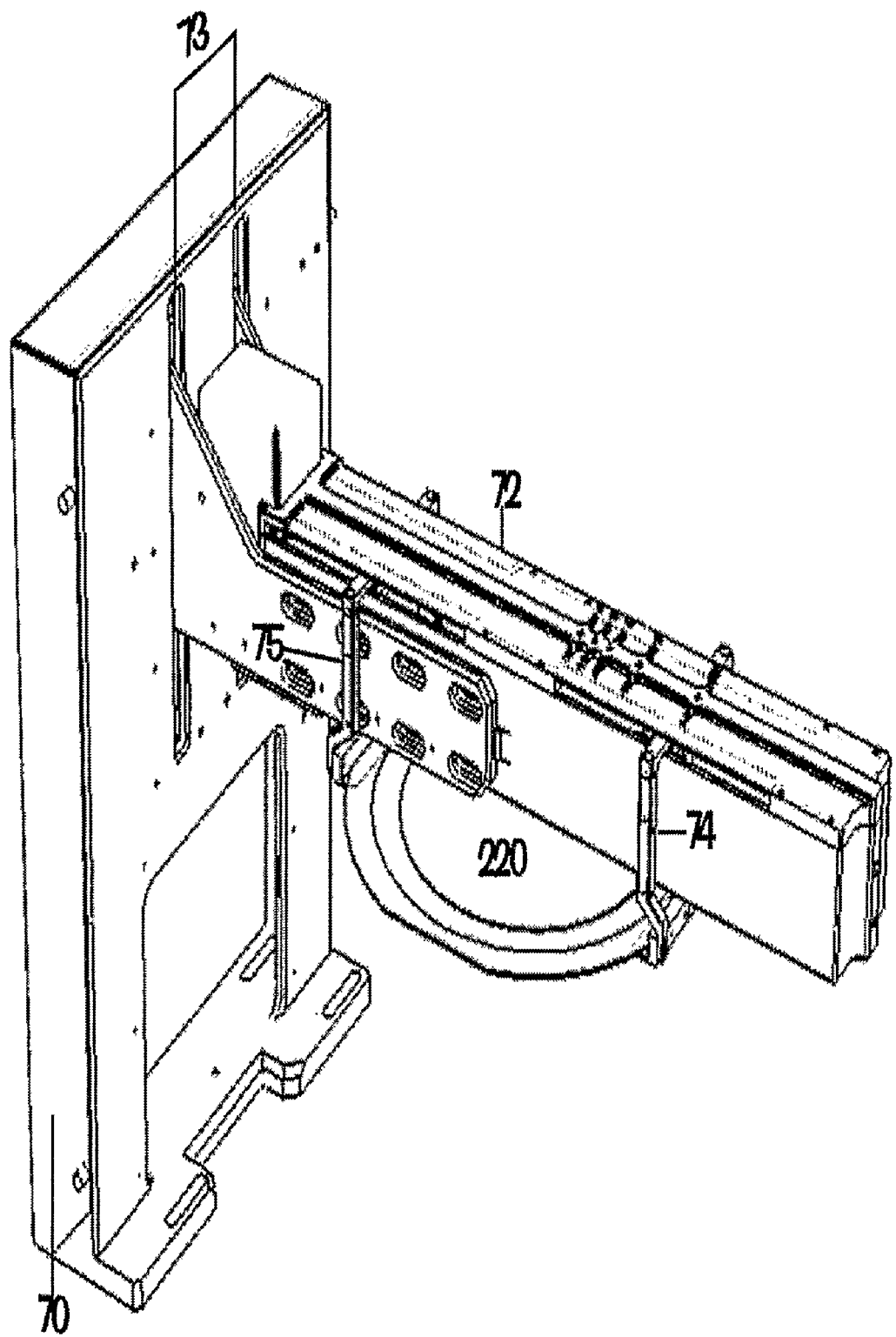

According to yet another embodiment of the invention both cassette holders are positioned within wafer inspection system 10. The inventors used two internal cassette holders able to support up to 300 mm wafer cassettes for diced and non diced wafer cassettes FIG. 4 illustrates object removal station 70 and chuck 100 according to an embodiment of the invention. FIG. 5 illustrates object removal station 70 according to an embodiment of the invention.

Object removal station 70 includes horizontal beam 70 that can move upwards or downwards (for example by applying air pressure) along two vertical grooves 73 positioned in a vertical support wall. The vertical movement enables horizontal beam to fetch an object from chuck 100 and to provide an object to robot 20. Two object holders 74 and 75 can move along horizontal grooves within horizontal beam 70 such as to be positioned from each other at a distance that corresponds to the diameter (size) of the object that are supposed to hold. The object holders can have an L shaped profile, but this is not necessarily so. Once the object removal station 70 is instructed to hold an object the object holders move (towards each other) such as to hold the object from two opposite directions. The object can be released by moving object holders 74 and 74 away from each other. These object holders can be translated by an accurate step motor.

Conveniently, object removal station 70 can hold k'th object 220 above chuck 100, so that chuck 100 can remain at the same position during the removal of k'th object 220 by object removal station 70 and during the placement of the (k+1)'th object, by robot 20, on chuck 100.

Figure 6:
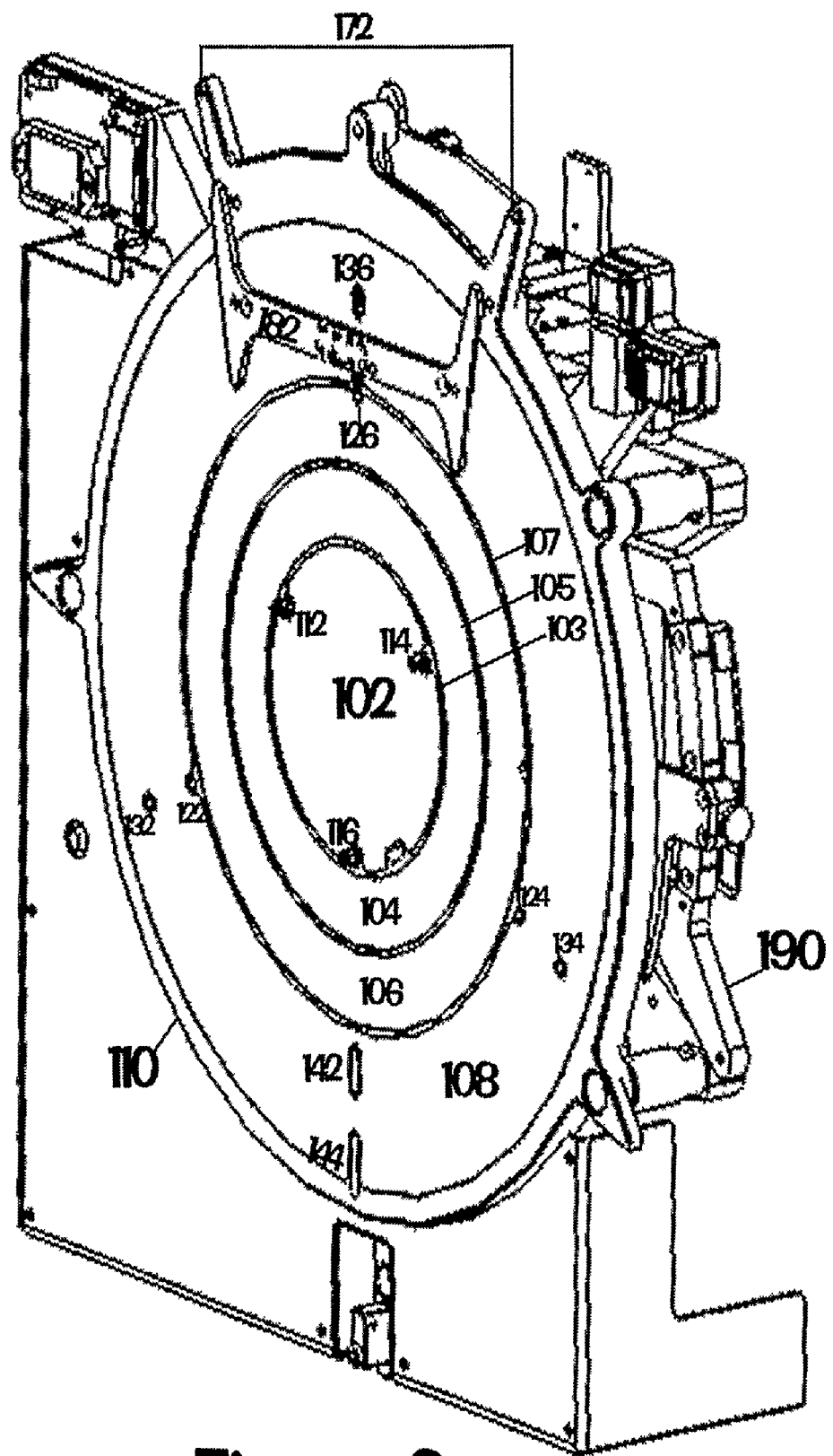
Figure 7:
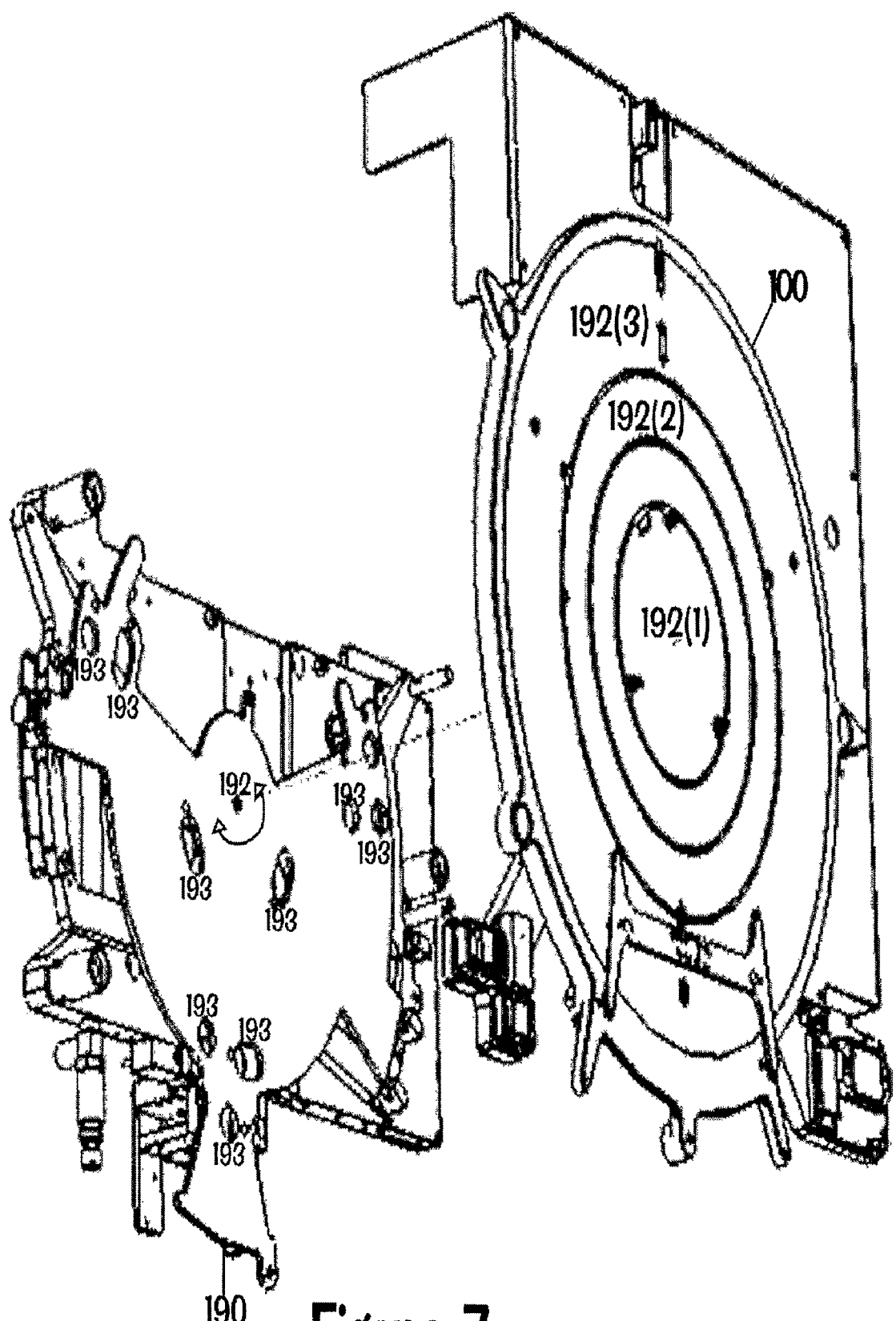
Figure 8:
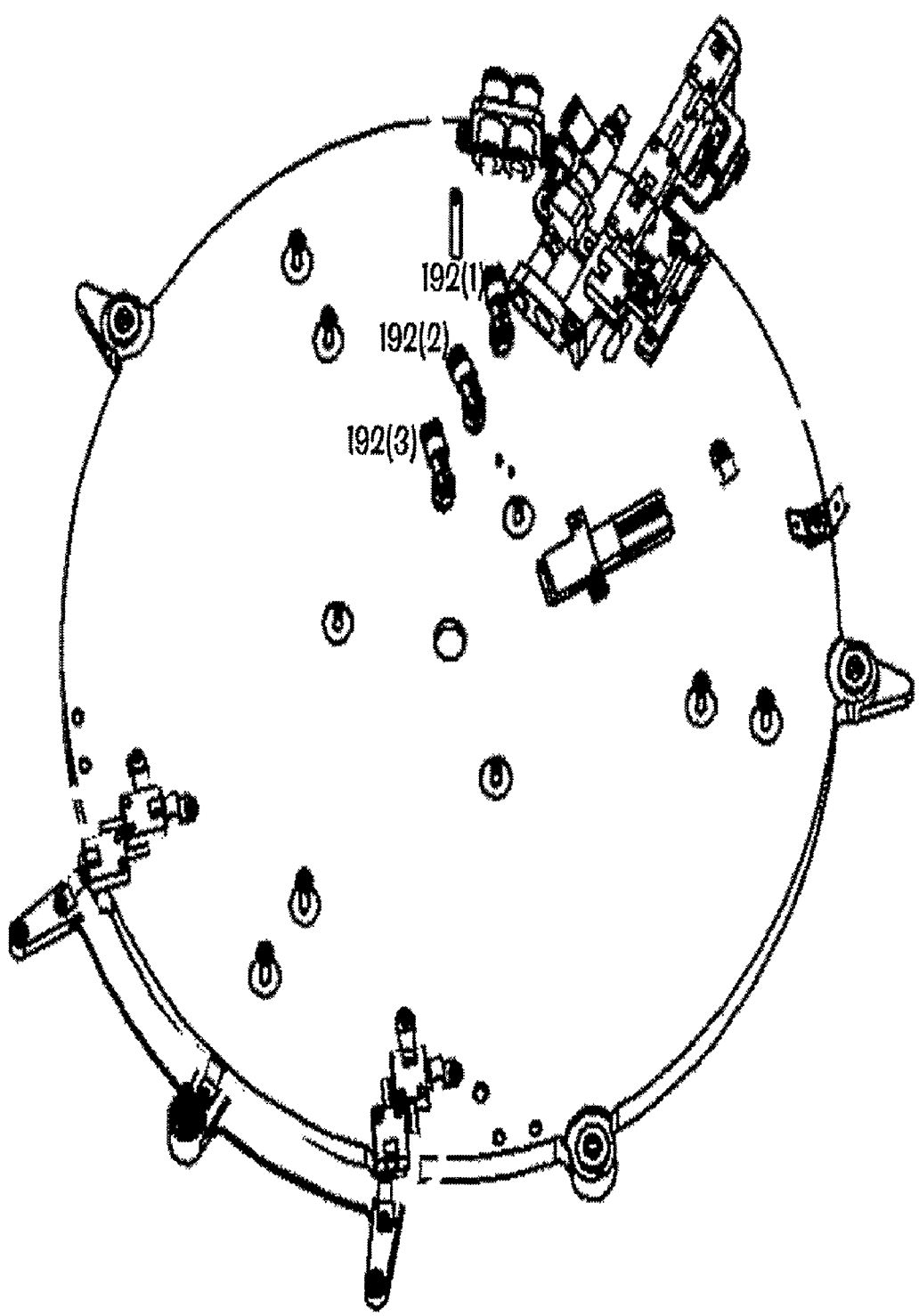
FIG. 8 illustrates a wafer inspection system according to an embodiment of the invention.

FIG. 6 illustrates chuck 100 according to an embodiment of the invention. FIG. 6 is an exploded view of chuck 100 according to an embodiment of the invention.

Chuck 100 includes a porous interface plate 110 on which an object can be placed. Vacuum can be induced via porous interface plate 110. Multiple vacuum conduits, such as 192(1)-192(3) are positioned below porous interface plate and have an opening that connect porous interface plate 100 in multiple locations. The porous interface plate 110 was made of stainless steel.

Porous interface plate 110 is divided to multiple concentric areas including circular area 102 as well as annular areas 104, 106 and 108. These areas are defined by non-porous rings 103, 105 and 107 accordingly. The areas are shaped and sized according to the expected sizes of objects to be supported by chuck 100. Conveniently, vacuum conduit 192(1) is positioned below area 102, vacuum conduit 192(2) is positioned below area 104 and vacuum conduit 192(3) is positioned below area 106.

Conveniently, vacuum can be induced in one or more of these selected areas such as to induce vacuum under an object while not inducing vacuum at areas that are not covered by the object. For example, if an object supported by chuck 100 and it covers circular area 102 and annular area 104 then vacuum is induced only in these areas.

According to an embodiment of the invention system 10 is adapted to determine the size of the object (conveniently in response to the size of the cassette that holds the object) and in response to this determination selectively activate the vacuum conduits positioned below the object.

Chuck 100 further includes multiple sets of vertically movable supporting pins 112-136, each set of pins is adapted to vertically move between a object reception position and between a lower position in which the vertically movable supporting pints do not exceed above porous interface plate 110. Conveniently an object is placed on a selected set of movable supporting pins that are gradually lowered to the lower position. An object is removed from chuck 100 after being lifted by the selected set of movable supporting pins.

FIG. 6 illustrates three sets of movable supporting pins. The first set includes movable supporting pins 112, 114 and 116. The second set includes movable supporting pins 122, 124 and 126. The third set includes movable supporting pins 122, 124 and 126. It is noted that at each moment only one set of movable supporting pins can be located above porous interface plate 110. The selection between sets is responsive to the shape and size of the object to be supported by chuck 100.

Conveniently, if a frame is supported the set of movable supporting pins is selected such as to support the frame while not making contact with the diced wafer. Conveniently, at least some of the movable supporting pins have an oval shape, such as to enable them to support different sized frames.

According to an embodiment of the invention the selection of a selected set of movable supporting pins is made by pin supporting plate 190 that is positioned below the porous interface plate 110. Pin supporting plate 190 can rotate about its axis 192. Multiple holes (collectively denoted 193) are positioned in various locations of pin supporting plate 190. Pin supporting plate 190 includes holes placed in locations that are defined in response to a relationship between locations of the multiple sets of vertically movable supporting pins and the multiple possible positions of the vertically movable supporting pins.

The rotation of pin supporting plate 190 can place the rotating pin supporting plate 190 at multiple positions, where when placed at a certain position the holes are positioned beneath all non-selected vertically movable pin sets. Accordingly, when the pin supporting plate is elevated only the selected set of movable supporting pins moves upwards, while the other movable supporting pins remain below the porous interface plate 110.

All movable supporting pins can be pressed, by corresponding springs, downwards. The elevation of pin supporting plate 190 overcomes the springs of the selected set of movable supporting pins.

Conveniently, system 10 is adapted to direct air towards the porous interface plate before the wafer is lifted. This can occur when the vacuum beneath the supported object is stopped.

According to an embodiment of the invention, while a frame is lowered towards porous interface plate 110 the chuck performs a registration operation such as align the frame with chuck 100. A similar registration operation is conducted when a wafer is placed on chuck 100.

The registration includes positioning the frame between an immobile register element and a movable register element. The immobile register element is held by a set of immobile register element holders. The immobile register element is shaped such as to fit within recesses of frames.

Figure 19:
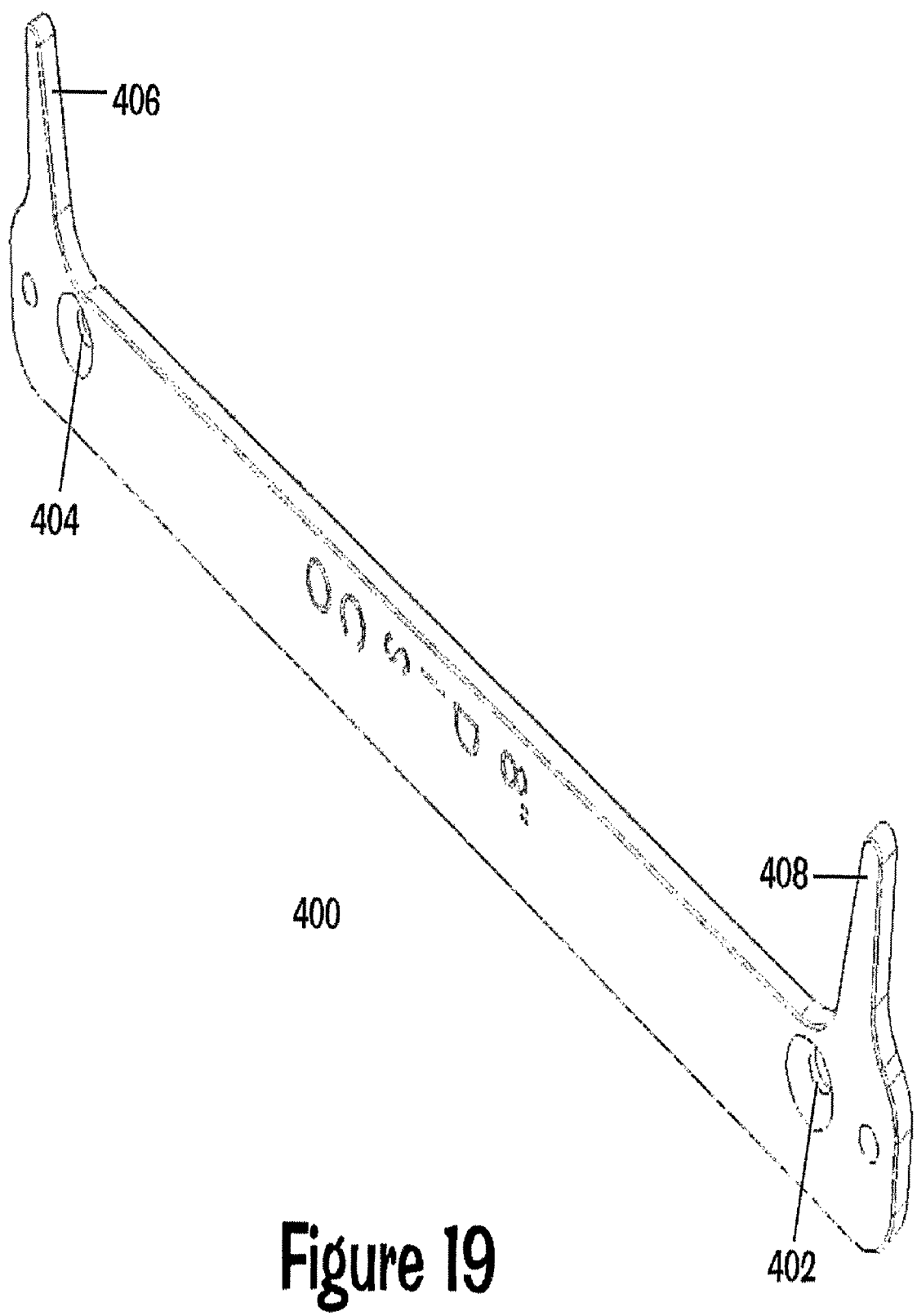
FIG. 19-20 illustrate immobile object register elements, according to an embodiment of the invention.
Figure 20:
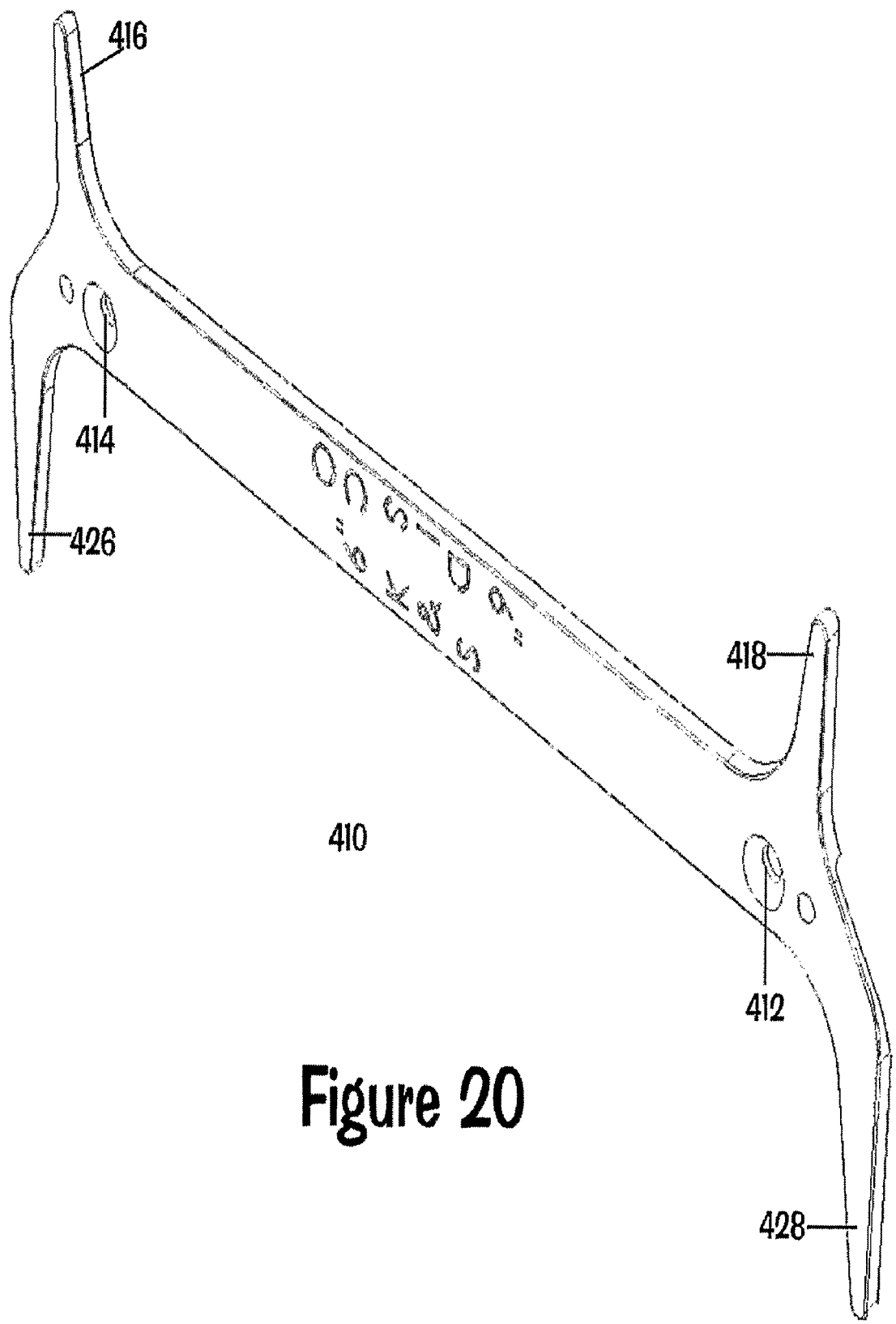

Different frame standards and different frame sizes require different immobile register elements. Various immobile register elements are illustrated in FIGS. 19-20. For example, FIG. 19 illustrates an immobile register element 400 adapted to support an 8" Disco frame. Immobile register element 400 includes two vertically extending pins 404 and 406 that are placed within two immobile register element holders of chuck 100.

Yet for another example, FIG. 20 illustrates an immobile register element 410 adapted to support either a 6" Disco frame or a 6" K&S frame. The selection between these frames include positioning immobile register element 410 at a first position or at a second position that is opposite to the first position. Immobile register element 400 includes two vertically extending pins 414 and 416 that are placed within two immobile register element holders of chuck 100. When placed at the first position pin 414 is placed into a first holder and pin 416 is placed in the second holder. When placed at the second position pin 416 is placed into the first holder and pin 414 is placed in the second holder. Conveniently, one pin is shorter than the other thus allowing wafer inspection system 10 to sense whether immobile register element 410 is placed at the first or at the second position.

Conveniently, the registration process includes moving the movable register element towards the immobile register element such that all register elements contact the object.

Referring back to FIG. 6, chuck 100 includes two register element tunnels 142 and 144 that are spaced apart from each other and placed at different distances form the center of chuck 100. First register element tunnel 142 is used for smaller frames than second register element tunnel 144. The movable register element can be a vertical pin that can be placed into the selected tunnel, according to the size of the supported object.

The inventors used a magnet to insert (and remove) the movable register element to (and from) the tunnels.

Conveniently, the movement of the movable register element is synchronized with the lowering of the movable supporting pins, thus the registration is completed when the object touches the porous interface plate 110.

Figure 10:
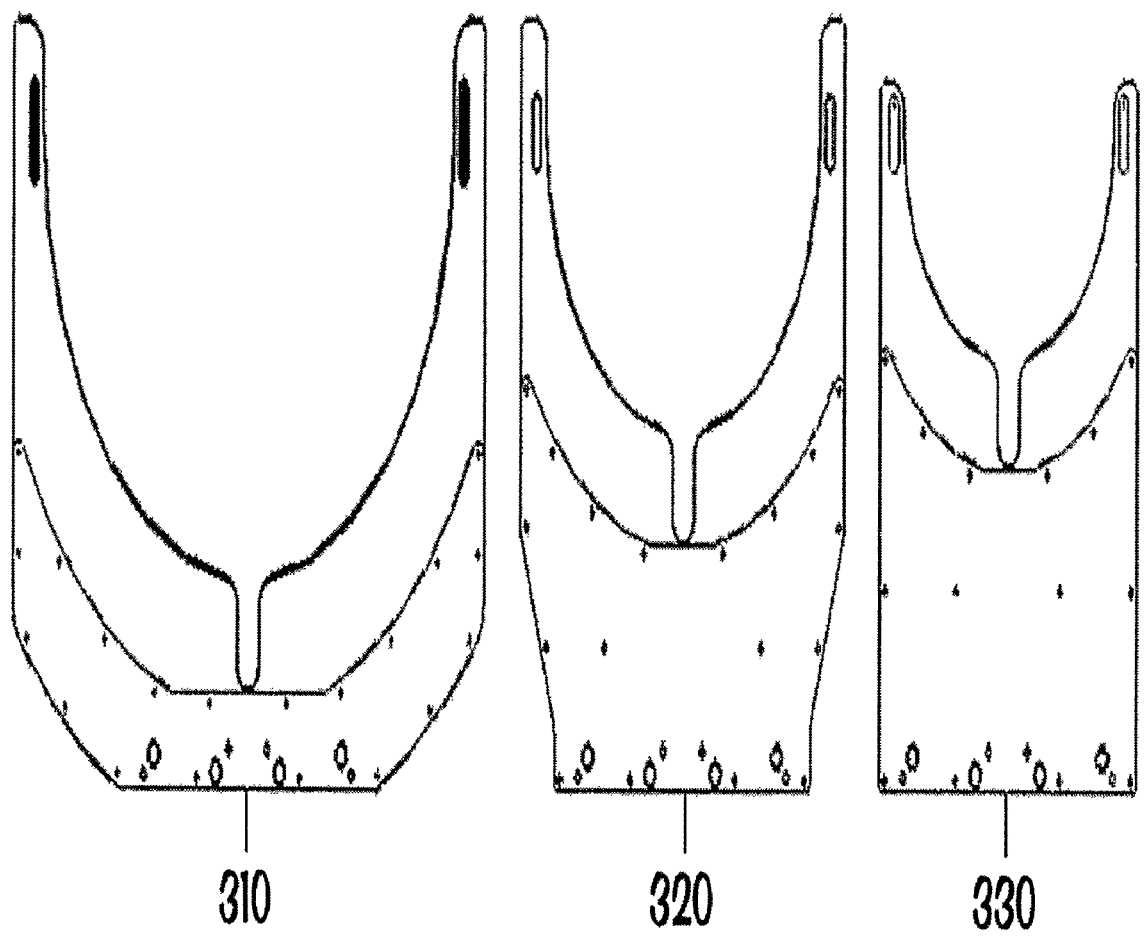
FIG. 10-12 illustrate diced wafer detachable adaptors, according to an embodiment of the invention.
Figure 11:
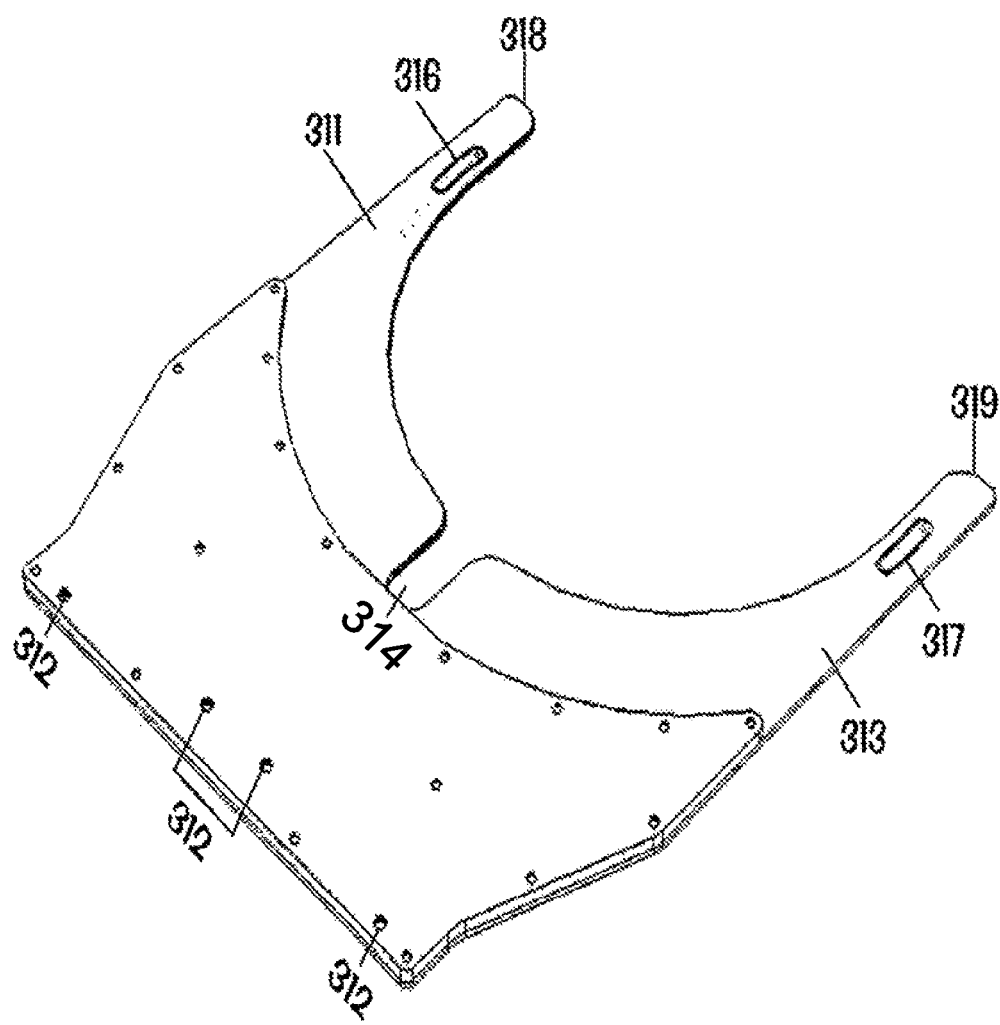
Figure 12:
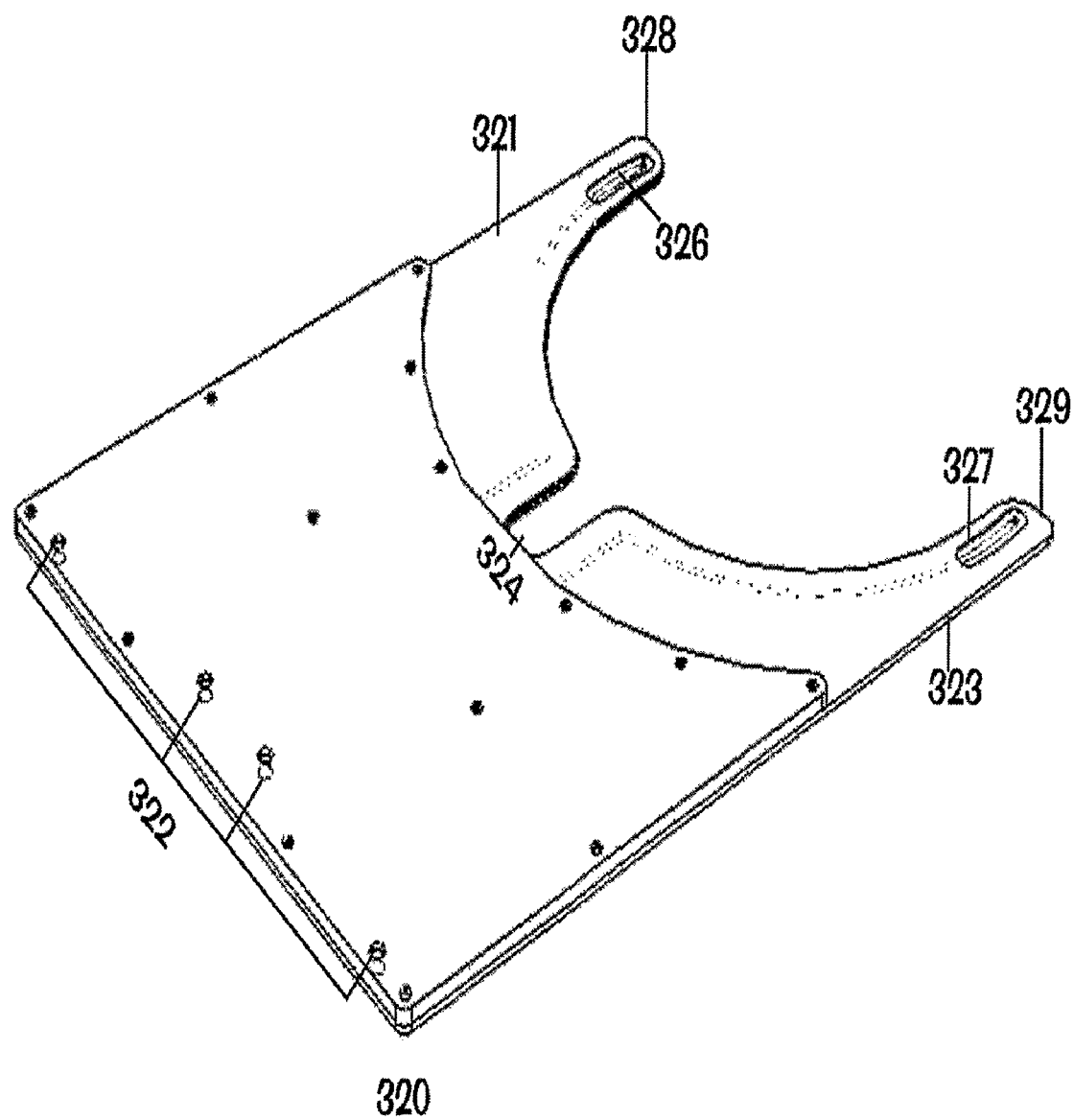
Figure 13:
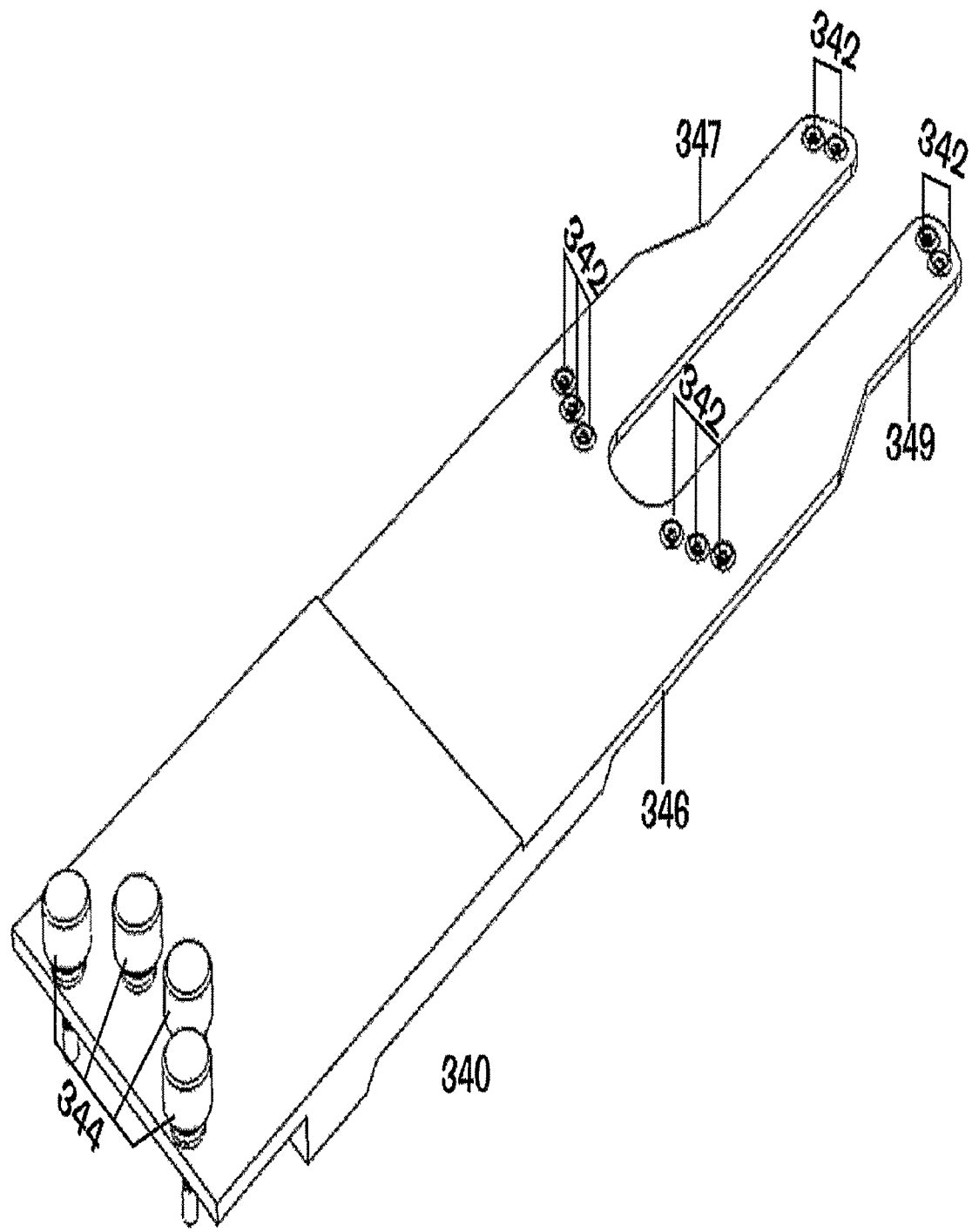
FIG. 13-18 illustrate non-diced wafer detachable adaptors, according to an embodiment of the invention.
Figure 14:
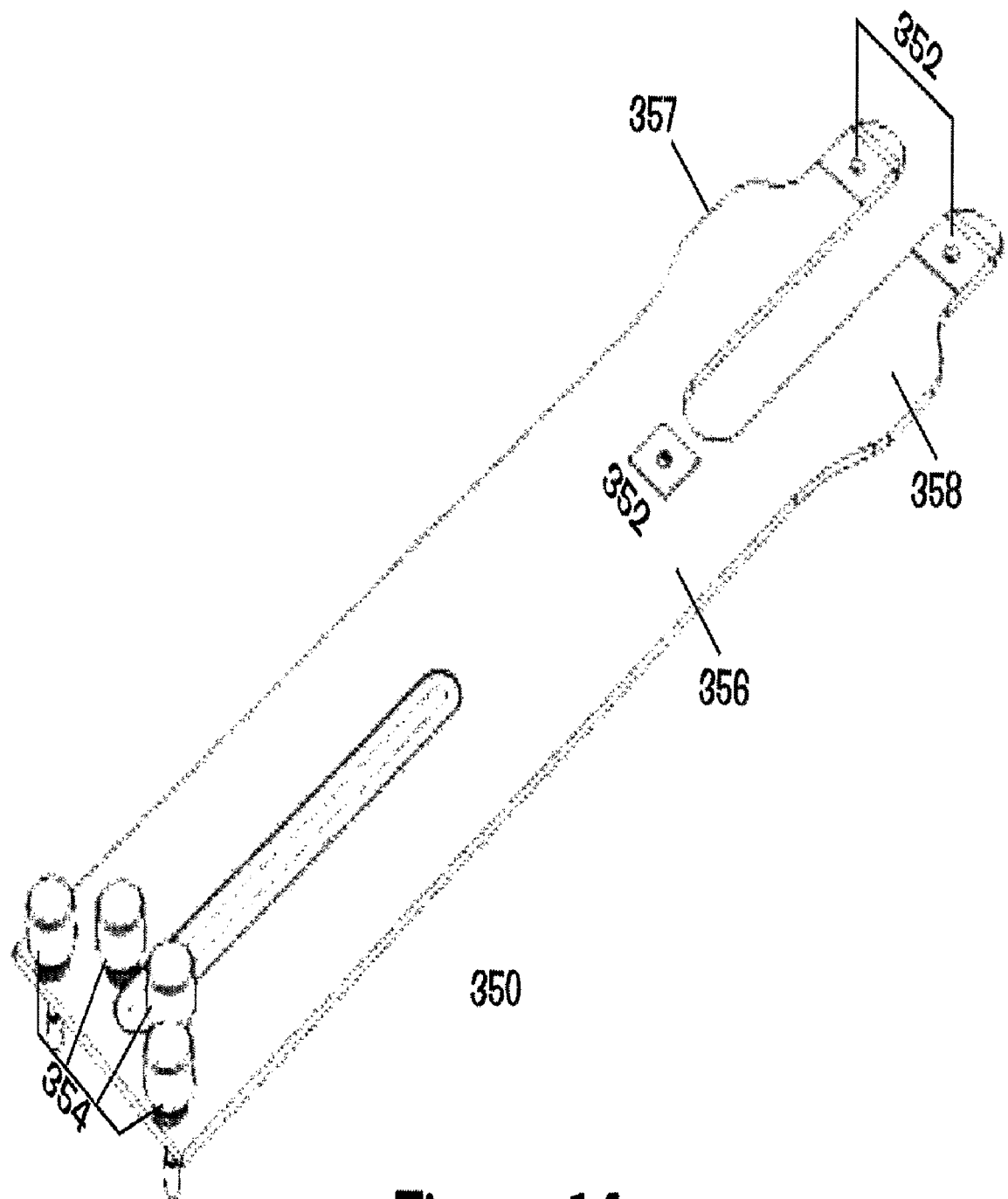
Figure 15:
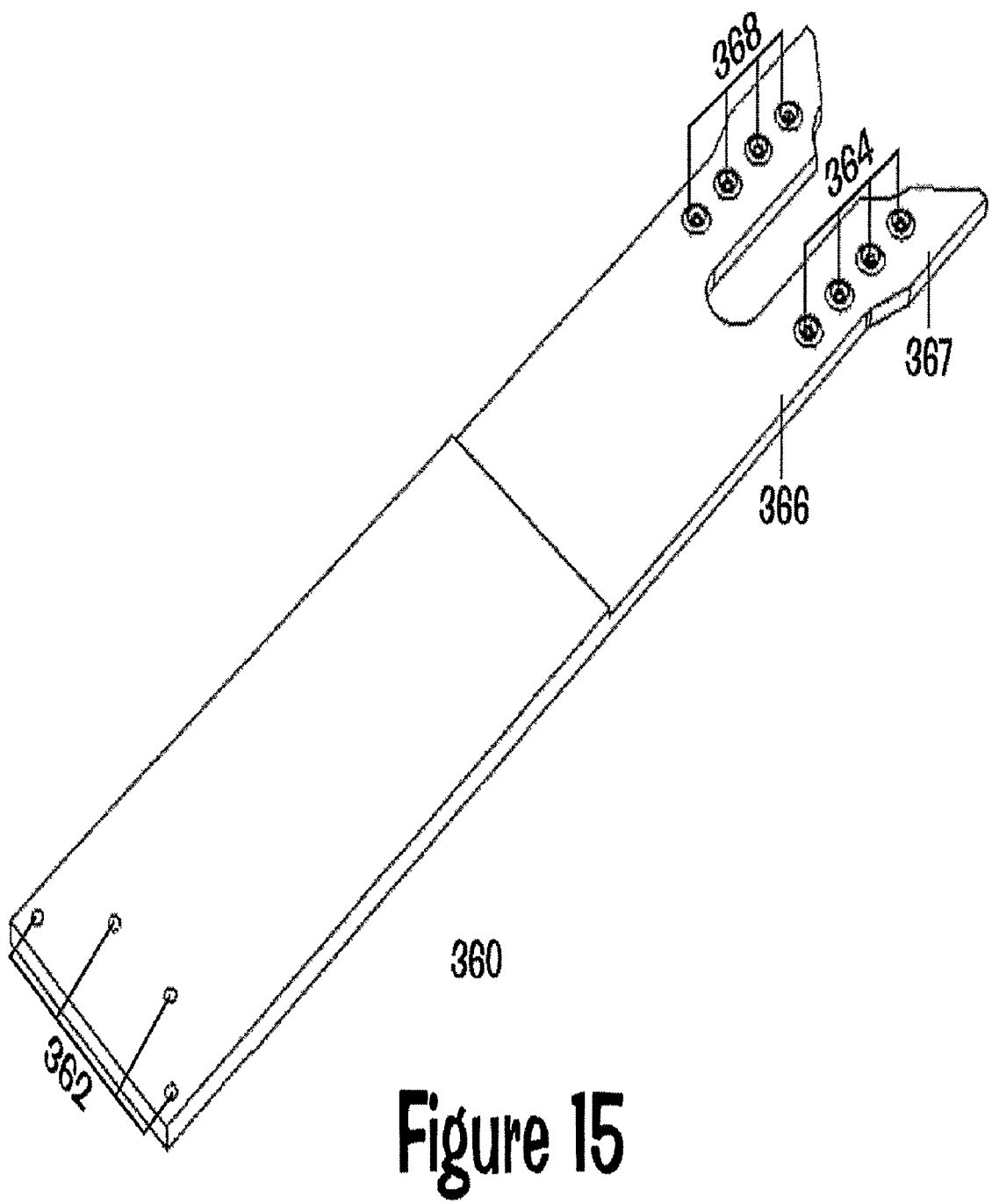
Figure 16:
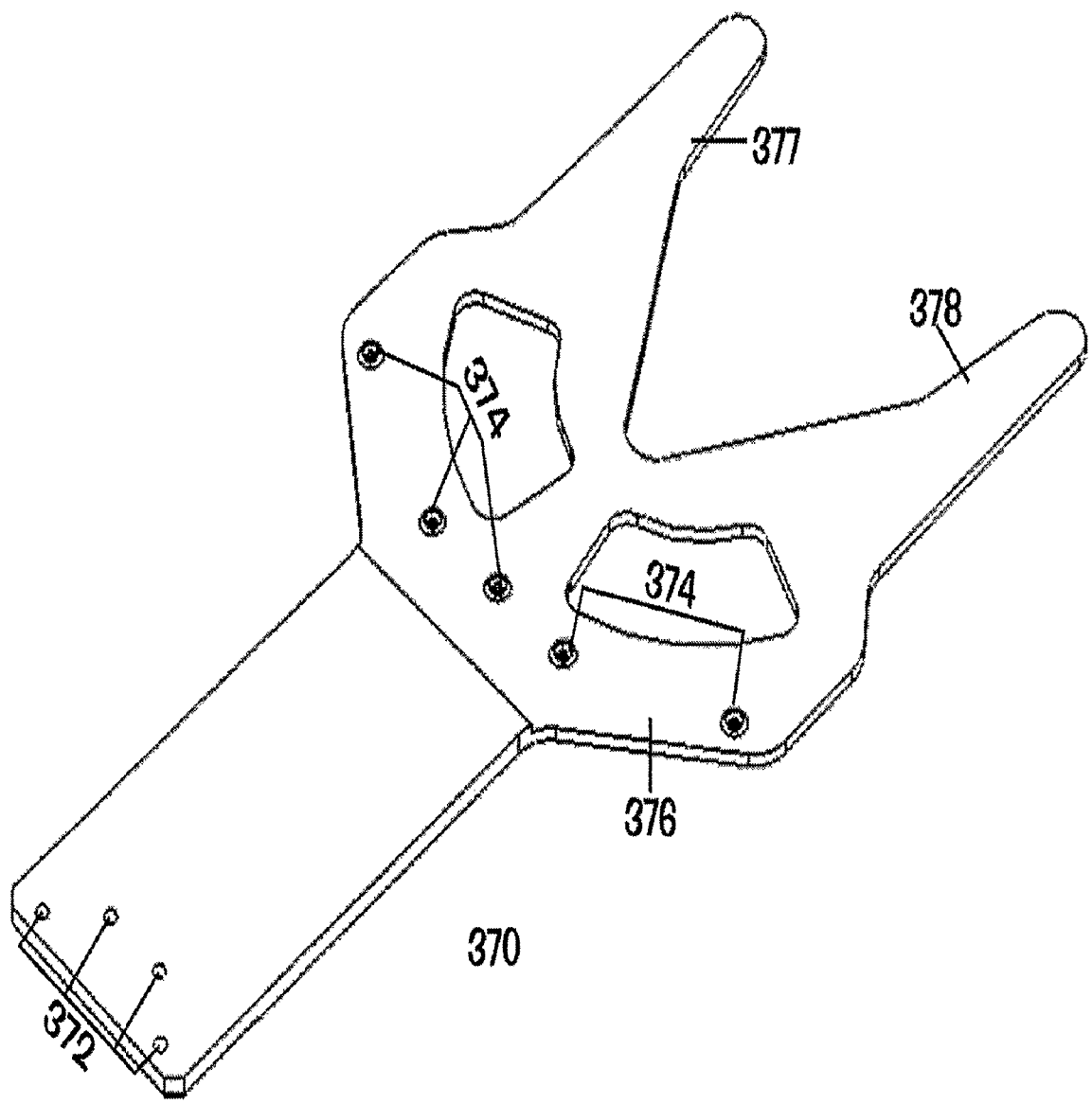
Figure 17:
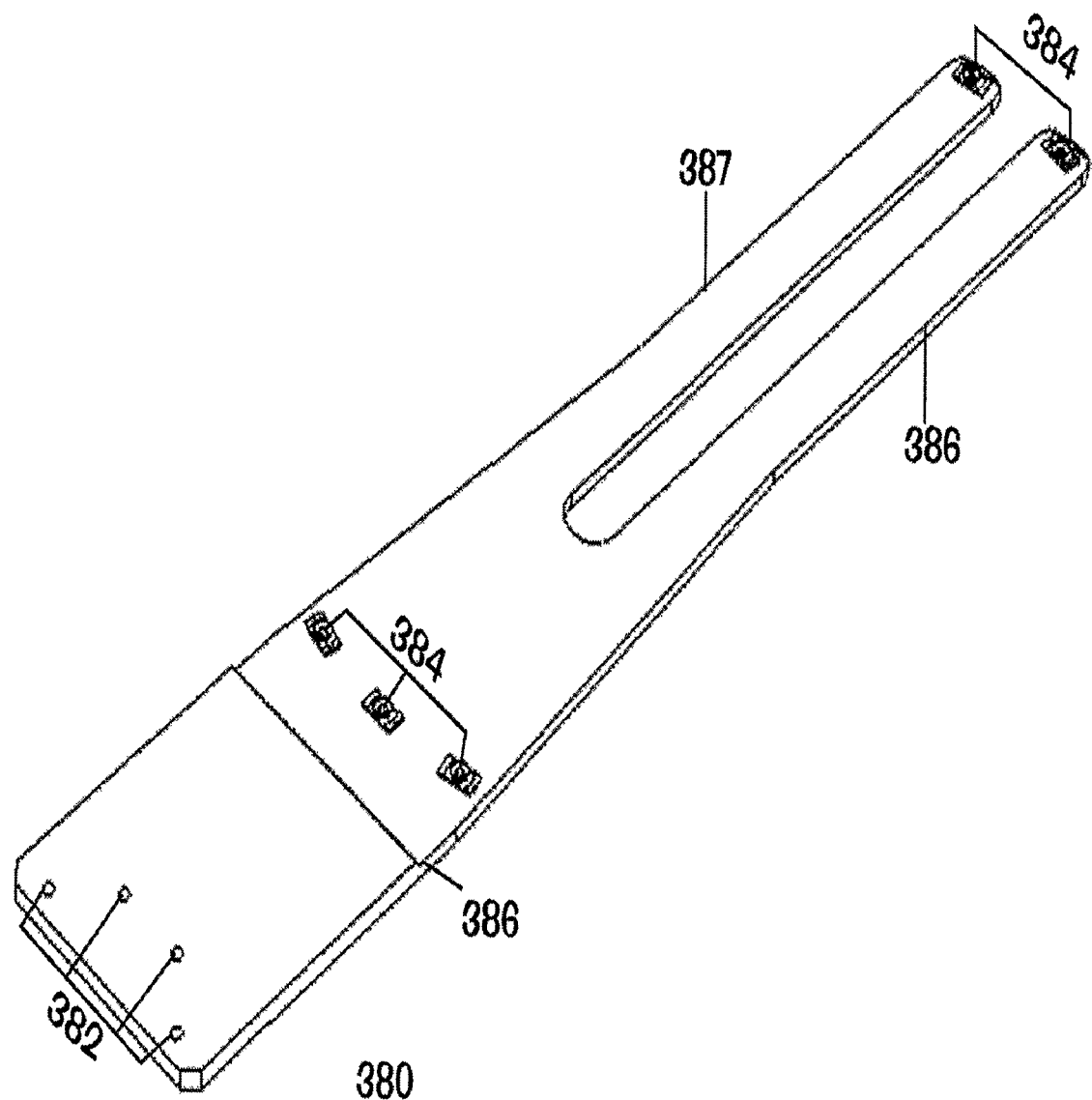
Figure 18:
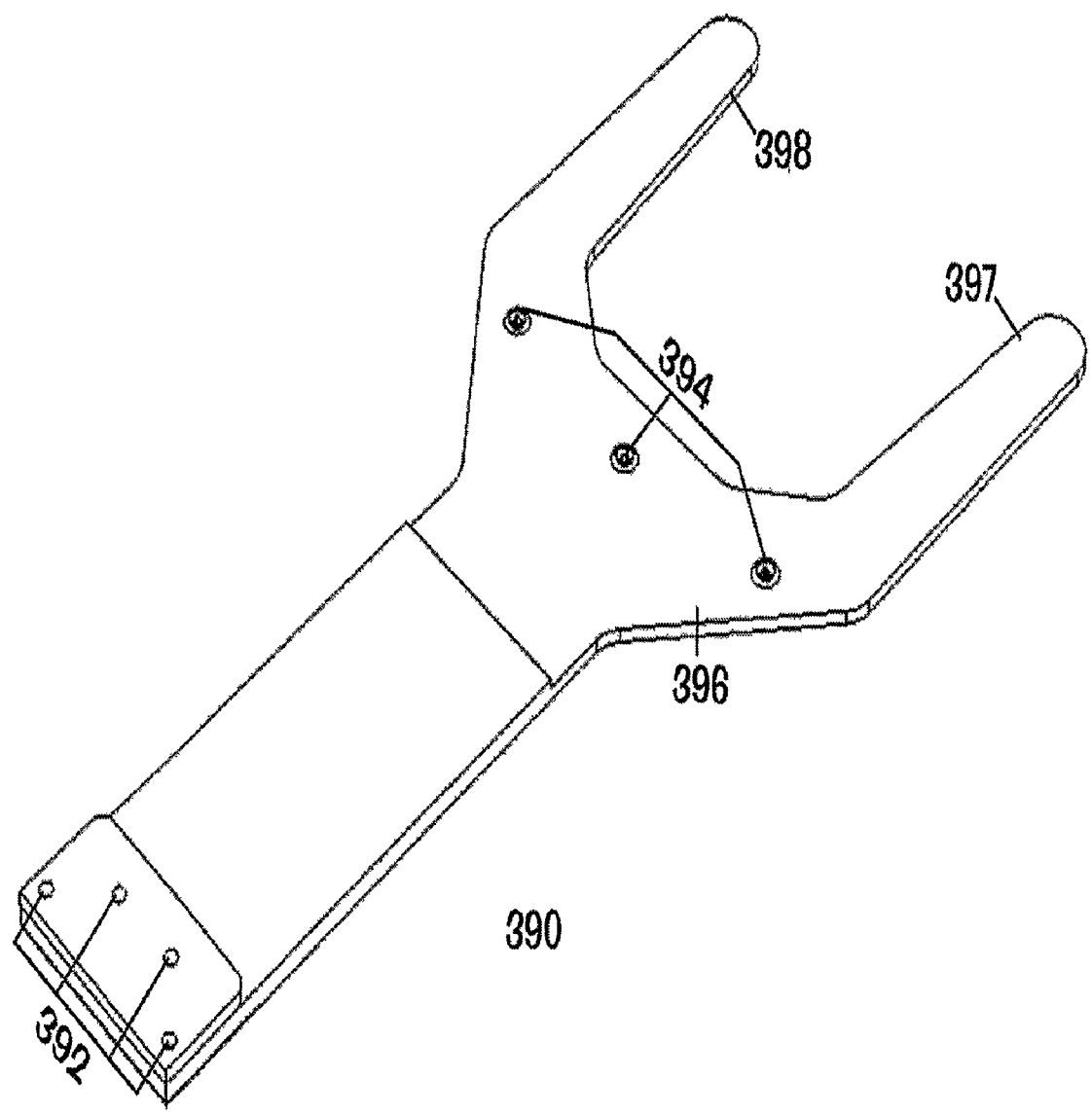

FIGS. 10-12 illustrate diced wafer detachable adaptors 310-330, according to an embodiment of the invention. FIG. 10 provides a general overview of diced wafer detachable adaptors 310-330. FIG. 11 provides a more detailed description of diced wafer detachable adaptor 310. FIG. 12 provides a more detailed description of diced wafer detachable adaptor 320, according to various embodiments of the invention.

Diced wafer detachable adaptor 310 is bigger than diced wafer detachable adaptor 320 that in turn is bigger than diced wafer detachable adaptor 330. The different diced wafer detachable adaptors are adapted to support frames of different sizes. Adaptors 310-330 are adapted to be connected to a movable element of robot 20 by multiple screws. For example, each adaptor includes four recesses (such as recesses 312 of FIG. 11, recesses 322 of FIG. 12) through with screws can be fastened.

Referring to FIG. 11, diced wafer detachable adaptor 310 is shaped such to partially surround the diced wafer (without touching the diced wafer) and it includes at least one vacuum groove (such as vacuum grooves 316, 317) adapted to apply vacuum on a tape that supports the diced wafer. Conveniently, vacuum grooves 316 and 316 are positioned such as to apply vacuum on a tape, near the inner edge of the frame that supports the diced wafer. During the final manufacturing stages of the wafer the wafer is diced (or sawn) in order to separate between the different dice. The wafer is usually placed on a tape that in turn is supported by a frame.

Diced wafer detachable adaptor 310 includes a pair of elongated support elements 311 and 313 spaced apart from each other by a distance that exceeds a diameter of a diced wafer supported by the diced wafer detachable adaptor. Thus, these elongated support elements 311 and 313 do not touch the diced wafer.

As illustrated by FIG. 11, vacuum grooves 316 and 317 are positioned near first ends 318 and 319 of elongated support elements 311 and 313.

In order to support the frame even when vacuums is not applied, the distance between each of first ends 318 and 319 and rear support point 314 that supports a rear edge of the frame exceeds a radius of the frame. Thus, the elongated support elements 311 and 313 exceed the center of gravity of the supported frame.

Referring to FIG. 12, diced wafer detachable adaptor 320 wherein is shaped such to partially surround the diced wafer (without touching the diced wafer) and it includes at least one vacuum groove (such as vacuum grooves 326, 327) adapted to apply vacuum on a tape that supports the diced wafer. Conveniently, vacuum grooves 326 and 326 are positioned such as to apply vacuum on a tape, near the inner edge of the frame that supports the diced wafer.

Diced wafer detachable adaptor 320 includes a pair of elongated support elements 321 and 323 spaced apart from each other by a distance that exceeds a diameter of a diced wafer supported by the diced wafer detachable adaptor. Thus, these elongated support elements 321 and 323 do not touch the diced wafer.

As illustrated by FIG. 12, vacuum grooves 326 and 327 are positioned near first ends 328 and 329 of elongated support elements 321 and 323.

In order to support the frame even when vacuums is not applied, the distance between each of first ends 328 and 329 and rear support point 324 that supports a rear edge of the frame exceeds a radius of the frame. Thus, the elongated support elements 321 and 323 exceed the center of gravity of the supported frame.

FIGS. 13-18 illustrate non-diced wafer detachable adaptors 340-390, according to various embodiments of the invention.

Different sized non-diced wafer detachable adaptors support different sized non-diced wafers.

Non-diced wafer detachable adaptors 340-390 are adapted to support a non-diced wafer can contact various points of the non-diced wafer, especially locations positioned along an imaginary axis that extends from the exterior of the non-diced wafer towards the center of the non-diced wafer.

Conveniently, each non-diced wafer detachable adaptor out of non-diced adaptors 340-390 supports the non-diced wafer by a supporting portion (such as supporting portions 346, 356, 366, 376, 386 396 of FIGS. 13-18) that is longer than the diameter of the supported non-diced wafer such as to properly support the non-diced wafer even when vacuums is not applied.

Multiple vacuum grooves (such as 342, 352, 364, 374, 384 and 394) are formed in each non-diced wafer detachable adaptors 340-280. Some vacuum grooves are placed near the end of the non-diced wafer detachable adaptors while some are positioned in other locations.

Each of Non-diced wafer detachable adaptors 340-390 includes a pair of elongated support members (such as 347 and 349, 357 and 358, 367 and 368, 377 and 378, 387 and 388) that are parallel to each and the distance between them does not exceeds the diameter of the supported non-diced wafer.

Figure 21:
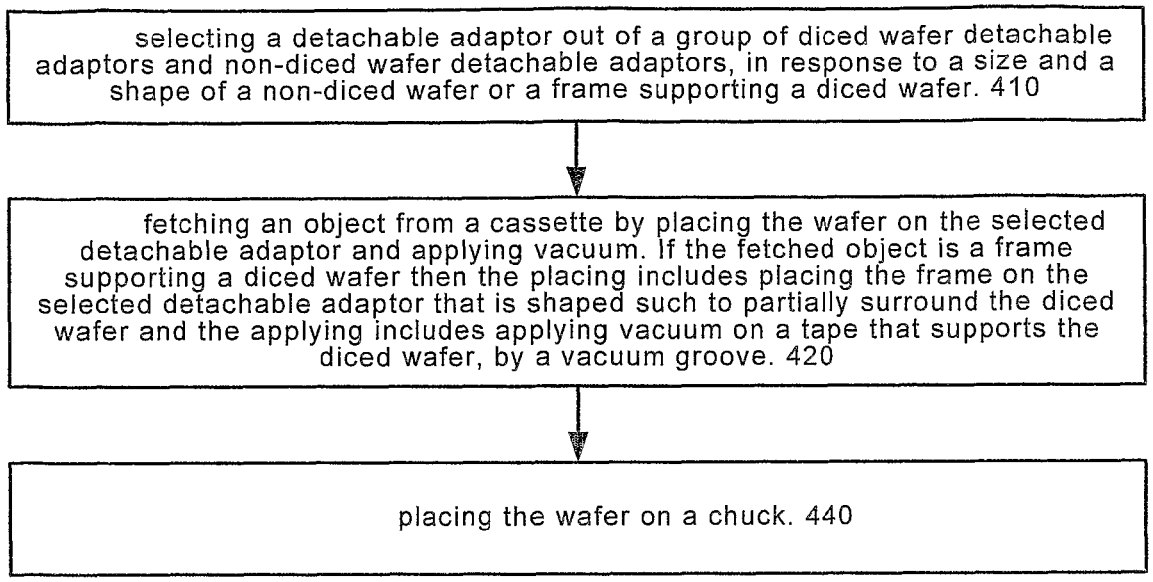
FIGS. 21-25 are flow charts of methods for inspecting an object, according to an embodiment of the invention.

FIG. 21 is a flow chart of method 400 for inspecting an object, according to an embodiment of the invention.

Method 400 starts by stage 410 of selecting a detachable adaptor out of a group of diced wafer detachable adaptors and non-diced wafer detachable adaptors, in response to a size and a shape of a non-diced wafer or a frame supporting a diced wafer.

Stage 410 is followed by stage 420 of fetching an object from a cassette by placing the wafer on the selected detachable adaptor and applying vacuum. If the fetched object is a frame supporting a diced wafer then the placing includes placing the frame on the selected detachable adaptor that is shaped such to partially surround the diced wafer and the applying includes applying vacuum on a tape that supports the diced wafer, by a vacuum groove.

Stage 420 is followed by stage 440 of placing the wafer on a chuck.

Conveniently, stage 410 of selecting includes connecting the detachable adaptor to the movable element by multiple screws.

Figure 22:
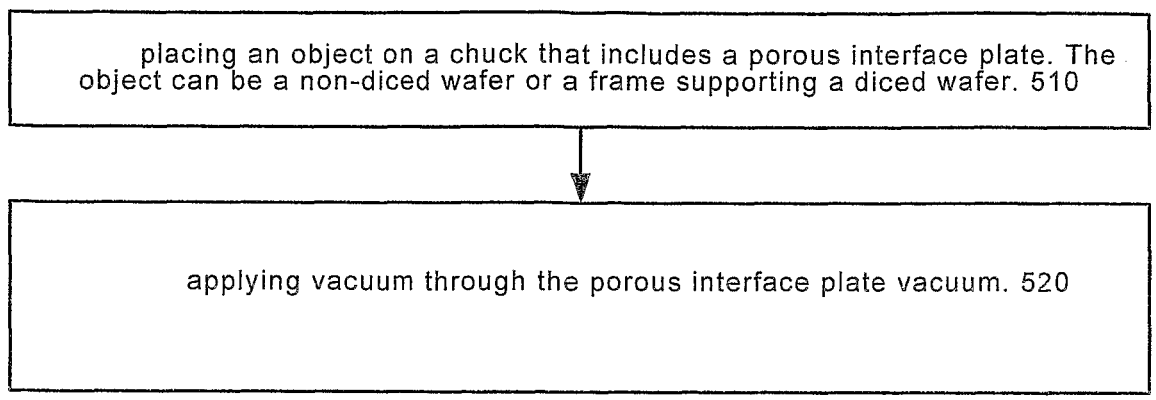

FIG. 22 is a flow chart of method 500 for inspecting an object, according to an embodiment of the invention.

Method 500 starts by stage 510 of placing an object on a chuck that includes a porous interface plate. The object can be a non-diced wafer or a frame supporting a diced wafer.

Stage 510 is followed by stage 520 of applying vacuum through the porous interface plate vacuum.

Conveniently, stage 520 of applying includes selectively applying vacuum at one or more areas of the porous interface plate depending on the object size.

Conveniently, stage 510 includes lowering the object by a selected set of movable supporting pins. The lowering can be preceded by selecting the selected set of movable supporting pins in response to the size and shape of the object. Conveniently, the selecting is followed by positioning a pin supporting plate at a selected location that corresponds to the selected set of movable pins.

Conveniently, method 500 includes directing air towards the porous interface before the object is lifted and the vacuum is stopped.

Figure 23:
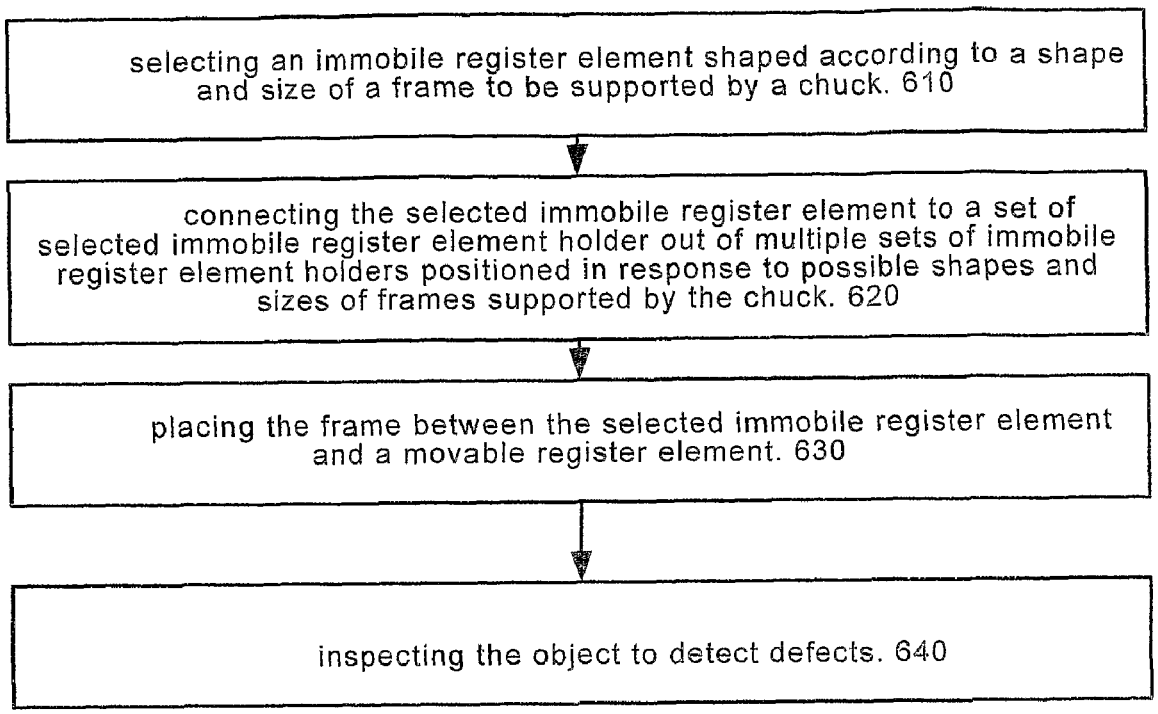

FIG. 23 is a flow chart of method 600 for inspecting an object, according to an embodiment of the invention.

Method 600 starts by stage 610 of selecting an immobile register element shaped according to a shape and size of a frame to be supported by a chuck.

Stage 610 is followed by stage 620 of connecting the selected immobile register element to a set of selected immobile register element holder out of multiple sets of immobile register element holders positioned in response to possible shapes and sizes of frames supported by the chuck.

Stage 620 is followed by stage 630 of placing the frame between the selected immobile register element and a movable register element.

Stage 630 is followed by stage 640 of inspecting the object to detect defects.

Conveniently, stage 630 of placing includes moving the movable register element towards the selected set of immobile register element holders such as to contact the frame and press the frame against an immobile register element connected to the set.

Conveniently, stage 630 of placing includes moving the movable register element during a lowering of the frame towards the chuck by multiple movable supporting pins.

Conveniently, stage 630 of placing includes moving the movable register element within a register element tunnel that is selected in response to a size of the frame.

Figure 24:
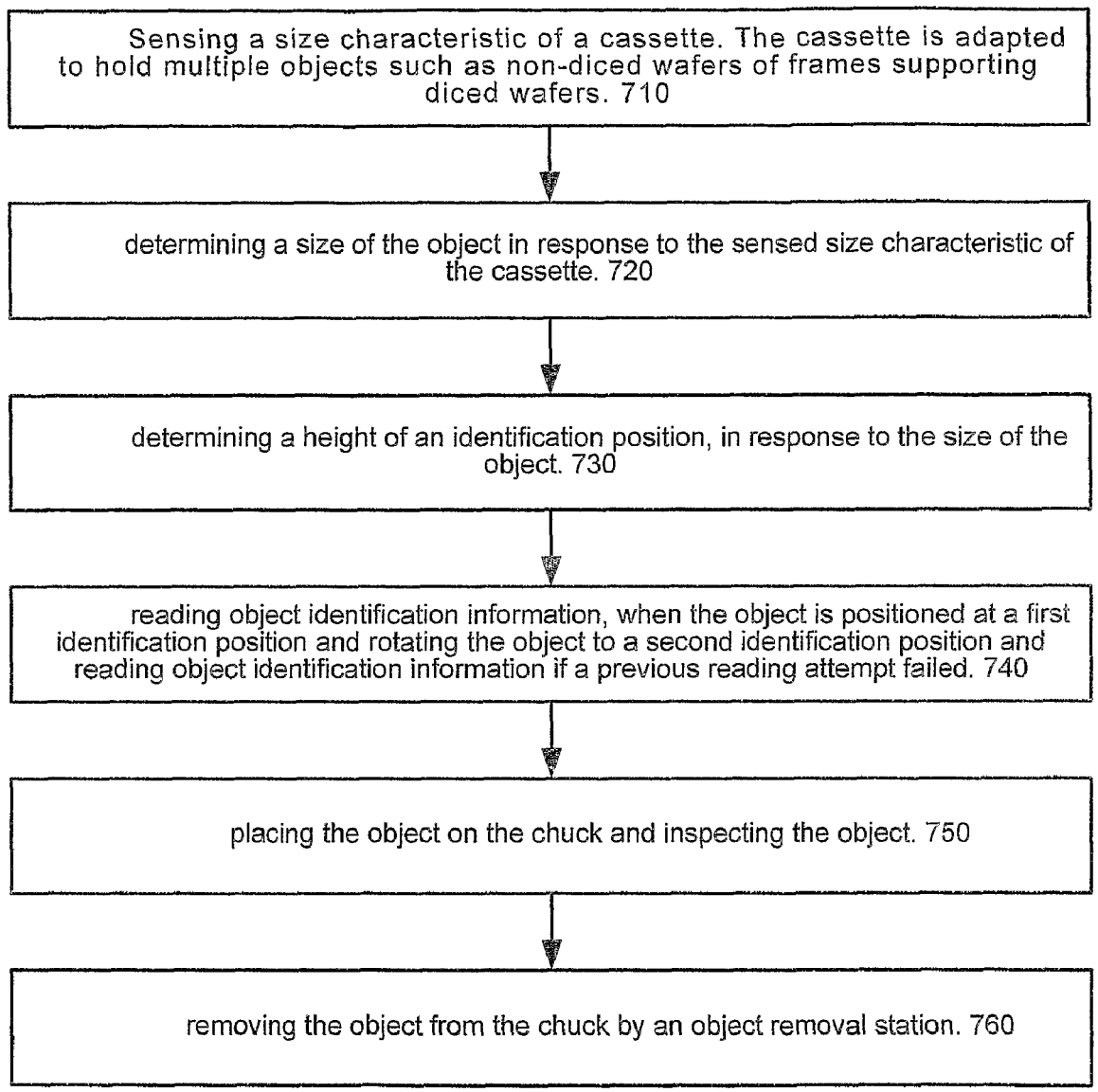

FIG. 24 is a flow chart of method 700 for inspecting an object, according to an embodiment of the invention.

Method 700 starts by stage 710 of sensing a size characteristic of a cassette. The cassette is adapted to hold multiple objects such as non-diced wafers or frames supporting diced wafers.

Stage 710 is followed by stage 720 of determining a size of the object in response to the sensed size characteristic of the cassette.

Stage 720 is followed by stage 730 of determining a height of an identification position, in response to the size of the object.

Stage 730 is followed by stage 740 of reading object identification information, when the object is positioned at a first identification position and rotating the object to a second identification position and reading object identification information if a previous reading attempt failed.

Stage 740 is followed by stage 750 of placing the object on the chuck and inspecting the object.

Conveniently, method 700 further includes stage 760 of removing the object from the chuck by an object removal station.

Conveniently, stage 760 is preceded by a stage of defining a location of object holders of the object removal station in response to a size of the object.

Figure 25:
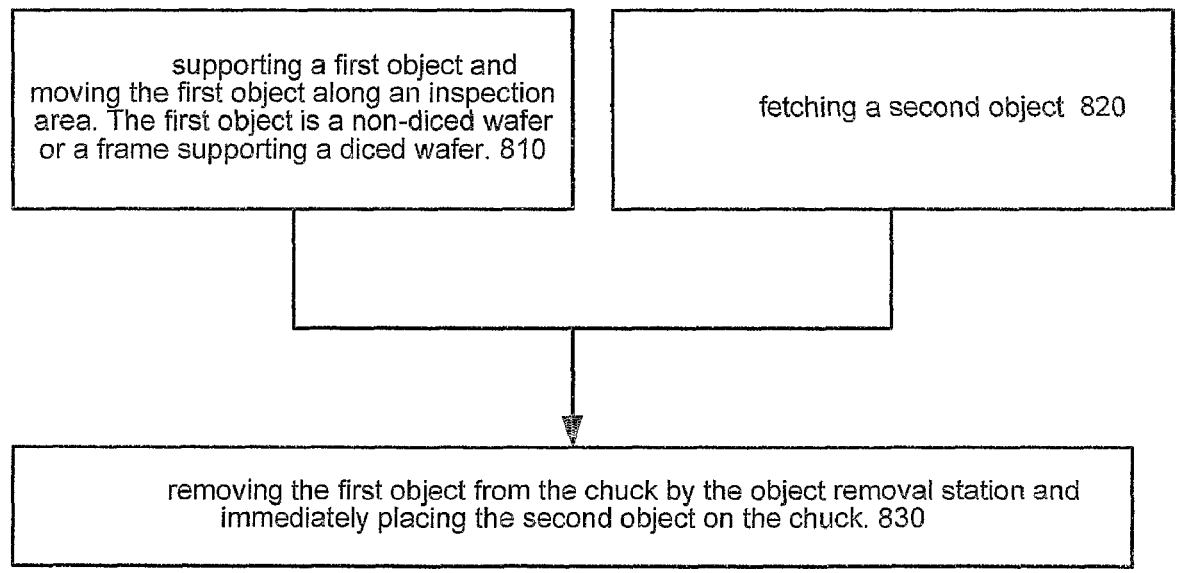

FIG. 25 is a flow chart of method 800 for inspecting an object, according to an embodiment of the invention.

Method 800 starts by stages 810 and 820. Stage 810 includes supporting a first object and moving the first object along an inspection area. The first object is a non-diced wafer or a frame supporting a diced wafer.

Stage 820 includes fetching a second object. Stage 810 and 820 are followed by stage 830 of placing the second object near the object removal station, removing the first object from the chuck by the object removal station and placing the second object on the chuck. Stage 830 can also include placing the first object, by the robot, to the cassette.

Conveniently, method 800 includes selecting a detachable adaptor out of a group of diced wafer detachable adaptors and non-diced wafer detachable adaptors, in response to a size and a shape of a non-diced wafer or a frame supporting a diced wafer.

Conveniently, method 800 includes placing an object on a chuck that includes a porous interface plate; wherein the object is selected from a group consisting of a non-diced wafer and a frame supporting a diced wafer; and applying vacuum through the porous interface plate vacuum.

Those of skill in the art will appreciate that one or more stage of one of the mentioned above method can be combined with one or more stage of another method, without departing from the scope of the invention.

Although the invention has been described in conjunction with specific embodiments thereof, it is evident that many alternatives, modifications and variations will be apparent to those skilled in the art, accordingly, it is intended to embrace all such alternatives, modifications and variations that fall within the spirit and broad scope of the appended claims.

We claim:

1. A wafer inspection system that comprises: an inspection head adapted to inspect a wafer placed at an inspection area; and a chuck adapted to place, at the inspection area, a selected frame that supports a tape on which a diced wafer is placed; wherein the selected frame is selected out of a group of frames that have different sizes and different sized recesses; wherein the chuck comprises multiple sets of immobile register element holders and at least one movable register element; wherein each set of immobile register element holders is adapted to hold an immobile register element; and wherein a spatial relationship between each set of an immobile register element holders and a movable register element of the at least one movable register element is responsive to a size of the selected frame.

2. The wafer inspection system according to claim 1 wherein a movable register element of the at least one movable register element is adapted to move towards a set of an immobile register element holders such as to contact the frame and press the frame against an immobile register element connected to the set.

3. The wafer inspection system according to claim 2 wherein the movable register element moves towards the set of an immobile register element holders while the frame is placed on the chuck.

4. The wafer inspection system of claim 1 wherein the chuck is further adapted to place, at the inspection area, a non-diced wafer that is selected of a group of non-diced wafers of different sizes; wherein a spatial relationship between at least one set of immobile register element holders and a movable register element of the at least one movable register element is responsive to a size of the selected wafer.

5. The wafer inspection system according to claim 1 wherein the chuck defines two movable register element tunnels; wherein the movable register element is adapted to move within a register element tunnel selected in response to a size of the frame.

6. A method for inspecting a wafer, the method comprises: selecting an immobile register element shaped according to a shape and size of a frame to be supported by a chuck; connecting the selected immobile register element to a set of selected immobile register element holder out of multiple sets of immobile register element holders positioned in response to possible shapes and sizes of frames supported by the chuck;

placing the frame between the selected immobile register element and a movable register element; and inspecting the wafer to detect defects; wherein the wafer is a diced wafer that is placed on a tape that is supported by the frame.

7. The method according to claim 6 wherein the placing comprises moving the movable register towards the selected set of immobile register element holders such as to contact the frame and press the frame against an immobile register element connected to the set.

8. The method according to claim 7 wherein the moving is performed during a lowering of the frame towards the chuck by multiple movable supporting pins.

9. The method according to claim 7 wherein the moving comprises moving the movable register element within a register element tunnel that is selected in response to a size of the frame.

* * * * *